United States Patent
Takata

(10) Patent No.: US 6,933,803 B2
(45) Date of Patent: Aug. 23, 2005

(54) SURFACE ACOUSTIC WAVE FILTER, BRANCHING FILTER, AND COMMUNICATION APPARATUS

(75) Inventor: Toshiaki Takata, Kanazawa (JP)

(73) Assignee: Murata Manufacturing Co., LTD, Kyoto (JP)

(*) Notice: Subject to any disclaimer, the term of this patent is extended or adjusted under 35 U.S.C. 154(b) by 78 days.

(21) Appl. No.: 10/464,653

(22) Filed: Jun. 19, 2003

(65) Prior Publication Data
US 2004/0027213 A1 Feb. 12, 2004

(30) Foreign Application Priority Data
Jun. 19, 2002 (JP) ......................... 2002-178235

(51) Int. Cl.$^7$ .............................. H01L 4/00; H03H 9/00
(52) U.S. Cl. ..................... 333/133; 333/196; 310/313 B
(58) Field of Search ......................... 333/133, 193–196; 310/313 B, 313 C, 313 D

(56) References Cited

U.S. PATENT DOCUMENTS 6,208,224 B1 * 3/2001 Taniguchi et al. .......... 333/193
6,489,863 B2 * 12/2002 Taniguchi ................... 333/193

FOREIGN PATENT DOCUMENTS

| JP | 5-183380 | 7/1993 | |
| JP | 9-153753 | 6/1997 | |
| JP | 10242799 A * | 9/1998 | ............ H03H/9/64 |
| JP | 11-163664 | 6/1999 | |
| JP | 2001-500697 | 1/2001 | |

* cited by examiner

Primary Examiner—James H. Cho
(74) Attorney, Agent, or Firm—Keating & Bennett, LLP

(57) ABSTRACT

A surface acoustic wave filter includes a piezoelectric substrate and a plurality of one-terminal-pair surface acoustic wave resonators, which are disposed on the piezoelectric substrate in a ladder pattern and each of which includes an IDT electrode having a pair of comb electrodes. The one-terminal-pair surface acoustic wave resonators disposed in a ladder pattern include series resonators, all of which are thinned. The electrode pitch of the IDT electrode of at least one of the series resonators is different from that of the IDT electrodes of the other series resonators.

16 Claims, 27 Drawing Sheets

SURFACE ACOUSTIC WAVE FILTER, BRANCHING FILTER, AND COMMUNICATION APPARATUS

BACKGROUND OF THE INVENTION

1. Field of the Invention

The present invention relates to surface acoustic wave filters for use, for example, as band-pass filters. More specifically, the present invention relates to a surface acoustic wave filter including a plurality of one-terminal-pair surface acoustic wave resonators arranged in a ladder configuration, and also relates to a branching filter and a communication apparatus.

2. Description of the Related Art

In recent years, surface acoustic wave (SAW) filters including one-terminal-pair SAW resonators, which are used in a high-frequency band (RF band, in particular, GHz band or more) of communication apparatuses such as mobile phones, have been developed. The SAW filter is compact and lightweight, is highly resistant to shock and vibration, and is highly reliable with reduced variations. In addition, the circuit does not require adjustment, such that the filter can easily be automatically mounted. In addition, the filter is easily manufactured.

Although not shown, the one-terminal-pair SAW resonator includes a piezoelectric substrate, an interdigital transducer (hereinafter referred to as "IDT") including an interdigital electrode (hereinafter referred to as "IDT electrode") having a pair of comb electrodes, and two reflectors sandwiching the IDT on the right and left thereof (in the propagation direction of a surface acoustic wave (hereinafter referred to as SAW)), the IDT and the reflectors are aligned in the propagation direction of a SAW on the piezoelectric substrate.

The IDT is made of a metallic thin-film including aluminum or other suitable material, and functions as a SAW transducer, which transforms an input electric signal (AC) to a SAW (elastic energy) so as to propagate the SAW on the piezoelectric substrate and which also transforms the propagated SAW to an electric signal so as to output the signal. The reflectors reflect the propagated SAW in the propagated direction.

In such an IDT, a signal transform characteristic and a pass band are set by defining the length and width of each electrode finger of the IDT electrode, the pitch of adjacent electrode fingers, and the width of an overlapping portion of interdigitated electrode fingers. Also, in the reflector, a reflection characteristic is set by adjusting the width of each electrode finger and the pitch thereof.

As an example of the above-described SAW filter, Japanese Unexamined Patent Application Publication No. 5-183380 discloses a ladder band-pass filter in which a one-terminal-pair SAW resonator of a series arm and a one-terminal-pair SAW resonator of a parallel arm are alternately arranged.

In this ladder filter, a first one-terminal-pair SAW resonator is connected in series and a second one-terminal-pair SAW resonator is connected in parallel. By making the antiresonance frequency of the parallel resonator substantially correspond to the resonance frequency of the series resonator, very favorable filter characteristics of low loss and wide bandwidth are obtained. Therefore, this type of filter has been widely used in communication apparatuses.

Also, the above-described Japanese Unexamined Patent Application Publication No. 5-183380 discloses that a wide band filter characteristic is obtained by adding a series inductance to the series resonator or the parallel resonator.

However, this type of filter must have a favorable reflection characteristic and a steep attenuation characteristic at the vicinity of the pass band, in addition to a characteristic for use in a wide band. Also, in a filter typified by an Rx RF filter of GSM 1900 shown in FIG. 23, if attenuation bands exist in the vicinities of both sides of the pass band, adjustment is required so as to obtain a steep attenuation characteristic and an adequate pass bandwidth.

A method of applying a thinned electrode has been used to obtain a steep attenuation characteristic in the vicinity of the pass band. A thinned electrode is an IDT electrode in which a portion of electrode fingers is removed (see FIG. 24) or the polarity of a portion of electrode fingers is reversed (see FIG. 25) such that an electric field is not applied to the portion of the electrode fingers. Such thinning electrode is also referred to as withdrawal weighting.

Japanese Unexamined Patent Application Publication No. 11-163664 (published on Jun. 18, 1999) discloses a SAW filter including IDT electrodes which are uniformly thinned. In an embodiment thereof, a ladder filter is disclosed. As shown in FIG. 26, by thinning an IDT electrode, the antiresonance frequency is shifted toward the resonance frequency, such that the gap Δf between the resonance frequency and the antiresonance frequency is reduced. By applying this method to a ladder filter, adjustment can be performed, for example, the steepness in the vicinity of the pass band can be improved and the pass bandwidth can be reduced, as shown in FIG. 6 of the above-described Japanese Unexamined Patent Application Publication No. 11-163664.

Also, PCT Japanese Translation Patent Publication No. 2001-500697 (published on Jan. 16, 2001) discloses a ladder filter having similar advantages.

Further, Japanese Unexamined Patent Application Publication No. 9-153753 (published on Jun. 10, 1997) discloses the following method. In this method, weighting is performed such that the conductance of an IDT electrode is reduced to a small value in a desired frequency band. Further, by changing the electrode pitch, an adequate attenuation bandwidth is achieved. By using this method, a filter characteristic in which attenuation outside the pass band is steep and the attenuation bandwidth is wide is achieved. Incidentally, Japanese Unexamined Patent Application Publication No. 9-153753 does not disclose nor suggest thinning of the IDT electrode.

However, when a one-terminal-pair SAW resonator including a thinned IDT electrode is applied to a ladder filter, the attenuation characteristic of an attenuation band in the vicinity of the pass band increases, and thus, a frequency characteristic disadvantageously deteriorates.

The reason for this disadvantage is as follows. Due to a variation in the characteristic shown in FIG. 6 of Japanese Unexamined Patent Application Publication No. 11-163664, the impedance characteristic in the vicinity of a high-frequency side becomes less than the antiresonance frequency in a series resonator, and the impedance characteristic in the vicinity of a low-frequency side becomes greater than the resonance frequency in a parallel resonator. Accordingly, the impedance characteristic in the frequency range of the attenuation band varies.

FIG. 27 shows examples of the electrical frequency characteristic of a Tx filter, in which all series resonators are thinned at the same thinning ratio, which is varied, and the center frequency is adjusted by changing the entire electrode pitch so as to adjust the frequencies of the pass band and the attenuation band. The thinning ratio is a value indicating the ratio of thinned electrode fingers with respect to the number of pairs of electrode fingers of the IDT electrode.

FIG. 27 shows the above-described tendency: the frequency characteristic is deteriorated as the thinning ratio becomes higher. Therefore, even if a thinned electrode is applied to improve steepness, the attenuation characteristic of the entire attenuation band deteriorates due to a rise in the attenuation characteristic.

In the method described in Japanese Unexamined Patent Application Publication No. 9-153753, by weighting an electrode and changing the electrode pitch, the above-mentioned rise in the attenuation characteristic is suppressed and improved.

In Japanese Unexamined Patent Application Publication No. 9-153753, however, a thinned electrode is not disclosed and only an electrode using apodization is disclosed, which differs from the present application in its configuration. In the apodization, the area of an electrode is disadvantageously greater than that of a thinned electrode, and thus, a filter cannot be miniaturized as compared to the case where a thinned electrode is provided.

For example, if the electrodes of all series resonators are thinned at the same thinning ratio, the steepness is improved but the rise in the attenuation band is significant, as shown in FIG. 27.

On the other hand, if the electrode pitch is optimized, the rise in the attenuation band is reduced, but the reflection characteristic is deteriorated. Therefore, with the known configuration, it is difficult to optimize and improve both of reflection and attenuation characteristics.

SUMMARY OF THE INVENTION

To overcome the problems described above, preferred embodiments of the present invention provide a surface acoustic wave filter in which reflection and attenuation characteristics are greatly improved by changing not only an electrode pitch but also a thinning ratio.

According to a preferred embodiment of the present invention, a surface acoustic wave filter includes a piezoelectric substrate, and a plurality of one-terminal-pair surface acoustic wave resonators disposed on the piezoelectric substrate in a ladder configuration, each resonator including an IDT electrode having a pair of comb electrodes. The plurality of one-terminal-pair surface acoustic wave resonators include series resonators, wherein at least one of the series resonators is thinned, and more preferably, all of the series resonators are thinned. The IDT electrode of at least one of the series resonators has an electrode pitch that is different from that of the IDT electrodes of the other series resonators.

Preferably, in the above-described surface acoustic wave filter, the IDT electrode of at least one of the series resonators has a thinning ratio and an electrode pitch that are different from those of the IDT electrodes of the other series resonators.

The plurality of one-terminal-pair surface acoustic wave resonators are preferably arranged in a substantially T-shaped configuration, in which a series resonator is connected to each of input/output sides, and at least one of the series resonators other than the series resonator connected to the input/output sides has a thinning ratio and an electrode pitch that are different from those of the other series resonators.

The series resonator other than the series resonator connected to the input/output sides preferably has a greater thinning ratio and a smaller electrode pitch than those of the other series resonators.

Preferably, the above-described surface acoustic wave filter defines a transmission filter which requires attenuation outside a pass band in the vicinity of a high-frequency side of the pass band.

In this configuration, at least one of the series resonators is thinned, and the IDT electrode of at least one of the series resonators has an electrode pitch that is different from that of the IDT electrodes of the other series resonators. Accordingly, the attenuation characteristic, particularly the attenuation characteristic outside the pass band in the high-frequency side, is greatly improved by thinning. Also, a rise in the attenuation band is efficiently suppressed by changing the electrode pitch, and at the same time, the reflection characteristic in the pass band is greatly improved. Further, the attenuation characteristic outside the pass band (particularly in the high-frequency side) in the vicinity of the pass band and the reflection characteristic in the pass band are greatly improved in a well-balanced manner. As a result, a surface acoustic wave filter having greatly improved reflection and attenuation characteristics and lower loss as compared to the known art is provided.

According to another preferred embodiment of the present invention, a surface acoustic wave filter includes a piezoelectric substrate, and a plurality of one-terminal-pair surface acoustic wave resonators disposed on the piezoelectric substrate in a ladder pattern, each resonator including an IDT electrode having a pair of comb electrodes. The plurality of one-terminal-pair surface acoustic wave resonators include parallel resonators, wherein at least one of the parallel resonators is thinned, and more preferably, all of the parallel resonators are thinned. The IDT electrode of at least one of the parallel resonators has an electrode pitch that is different from that of the IDT electrodes of the other parallel resonators.

Preferably, in the above-described surface acoustic wave filter, the IDT electrode of at least one of the parallel resonators has a thinning ratio and an electrode pitch that are different from those of the IDT electrodes of the other parallel resonators.

The plurality of one-terminal-pair surface acoustic wave resonators are arranged in a π-shaped configuration, in which a parallel resonator is connected to each of input and output sides, and at least one of the parallel resonators other than the parallel resonator connected to the input/output sides has a thinning ratio and an electrode pitch that are different from those of the other parallel resonators.

The parallel resonator other than the parallel resonator connected to the input/output sides preferably has a greater thinning ratio and a smaller electrode pitch than those of the other parallel resonators.

Preferably, the above-described surface acoustic wave filter defines a reception filter which requires attenuation outside a pass band at the vicinity of a low-frequency side of the pass band.

In the above-described configuration, the IDT of at least one of the parallel resonators is thinned, and the electrode pitch and the thinning ratio of that IDT are different from those of the other parallel resonators. Accordingly, a steep attenuation characteristic outside the pass band in the vicinity of the pass band (particularly, in the low-frequency side), the attenuation characteristic in an attenuation band, and the reflection characteristic is greatly improved in a well-balanced manner. As a result, all the disadvantages of the known art are overcome, and a compact surface acoustic wave filter having greatly improved reflection and decompression characteristics and low loss is provided.

A branching filter according to another preferred embodiment of the present invention includes the above-described surface acoustic wave filter.

A communication apparatus according to another preferred embodiment of the present invention includes the above-described surface acoustic wave filter.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
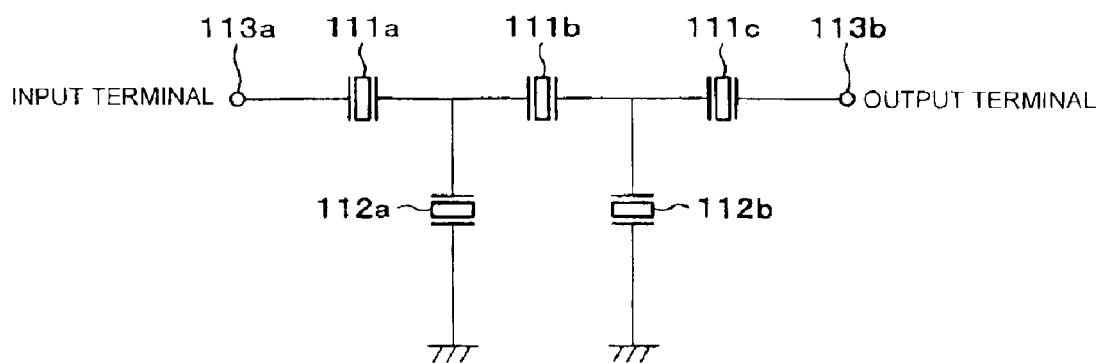
FIG. 1 is a circuit diagram of a surface acoustic wave (SAW) filter according to a first preferred embodiment of the present invention.
Figure 2:
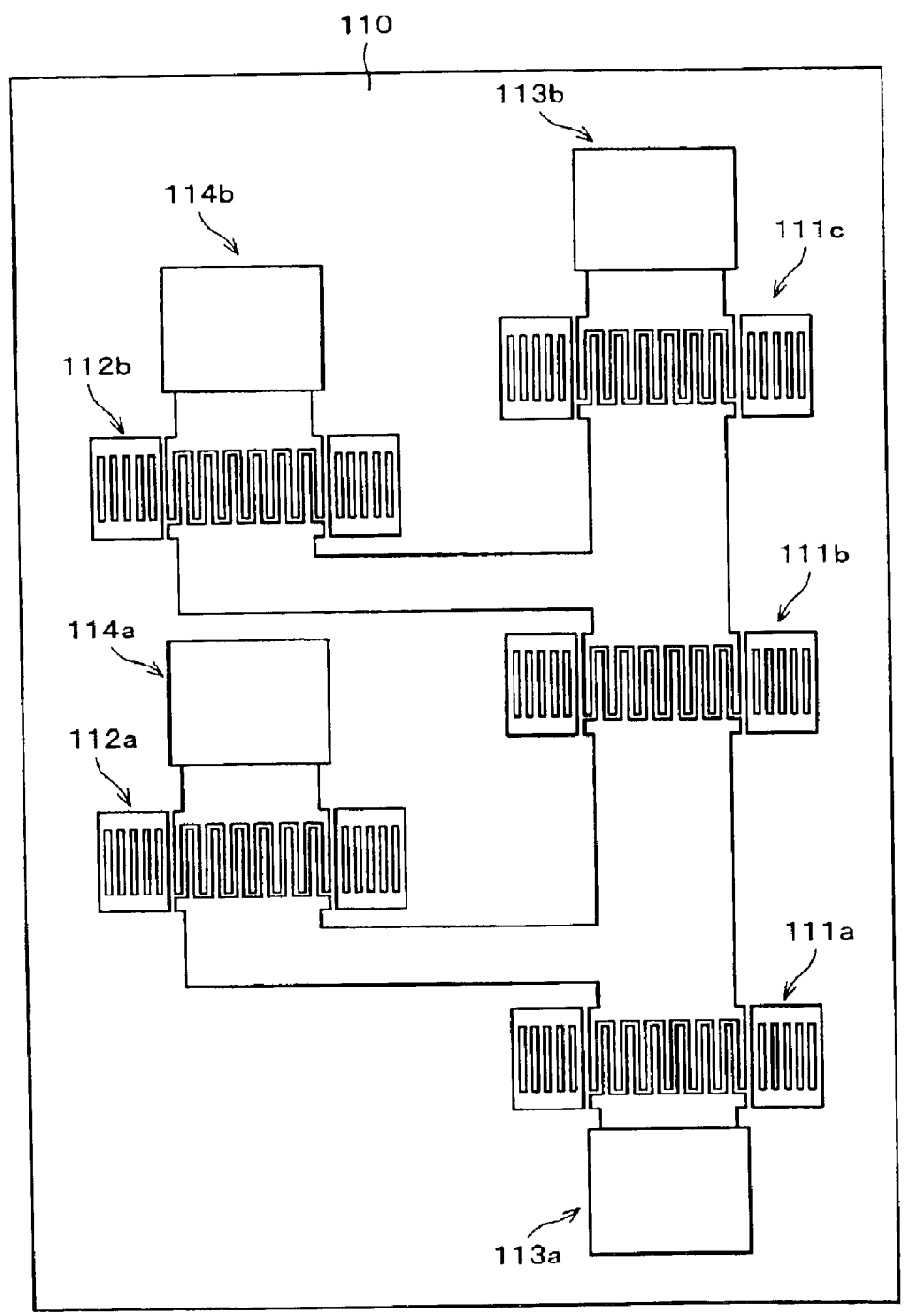
FIG. 2 is a schematic view showing the configuration of the SAW filter.

Hereinafter, preferred embodiments of a surface acoustic wave (SAW) filter according to the present invention will be described with reference to FIGS. 1 to 20.

First Preferred Embodiment

As a SAW filter according to the first preferred embodiment, a ladder-type Tx filter in which the center frequency of the pass band is 1441 MHz is preferably used. As shown in a circuit diagram in FIG. 1 and a schematic view in FIG. 2, the SAW filter includes series resonators 111a to 111c and parallel resonators 112a and 112b, which are arranged in a ladder pattern on a piezoelectric substrate 110.

Preferably, the series resonators 111a to 111c and the parallel resonators 112a and 112b are arranged such that the surface acoustic waves generated therefrom propagate substantially in parallel to each other, such that the filter is miniaturized.

The series resonators 111a to 111c are connected in series between an input terminal 113a and an output terminal 113b, and are aligned in a direction that is substantially perpendicular to the propagation direction of the surface acoustic waves generated from the series resonators 111a to 111c.

The parallel resonators 112a and 112b are connected between the series resonators 111a to 111c and the ground potential. Also, the parallel resonators 112a and 112b are aligned in a direction that is substantially perpendicular to the propagation direction of the surface acoustic waves generated from the parallel resonators 112a and 112b. Accordingly, the extension lines of the surface acoustic waves generated from the parallel resonators 112a and 112b do not overlap those of the surface acoustic waves generated from the series resonators 111a to 111c.

The above-described SAW filter preferably has a substantially T-shaped configuration, in which the series resonator 111a is connected to the input terminal 113a and the series resonator 111c is connected to the output terminal 113b.

In this specification, the above-described configuration is referred to as a T-shaped configuration, in which a series resonator are connected to each of input and output sides, however, the combination of the other series and parallel resonators may be arranged in any way. In the first preferred embodiment, the three series resonators 111a to 111c and the two parallel resonators 112a and 112b are disposed on the piezoelectric substrate 110 comprising 36° rotated Y-cut X-propagation LiTaO₃, by photolithography and lift-off.

The series resonators 111a and 111c have the same configuration, that is, the width of overlapping portion of electrode fingers is about 30 μm, the number of effective pairs of electrode fingers of the IDT electrode except thinned electrode finger(s) is about 200, and the number of electrode fingers of reflectors is about 100. On the other hand, the series resonator 111b has a different configuration, that is, the width of overlapping portion of electrode fingers is about 15 μm, the number of effective pairs of electrode fingers of the IDT electrode is about 200, and the number of electrode fingers of reflectors is about 100.

The parallel resonators 112a and 112b have the same configuration, that is, the width of overlapping portion of electrode fingers is about 30 μm, the number of pairs of electrode fingers of the IDT electrode is about 200, and the number of electrode fingers of reflectors is about 100. The IDT electrode of each of the three series resonators 111a to 111c is thinned.

Figure 25:
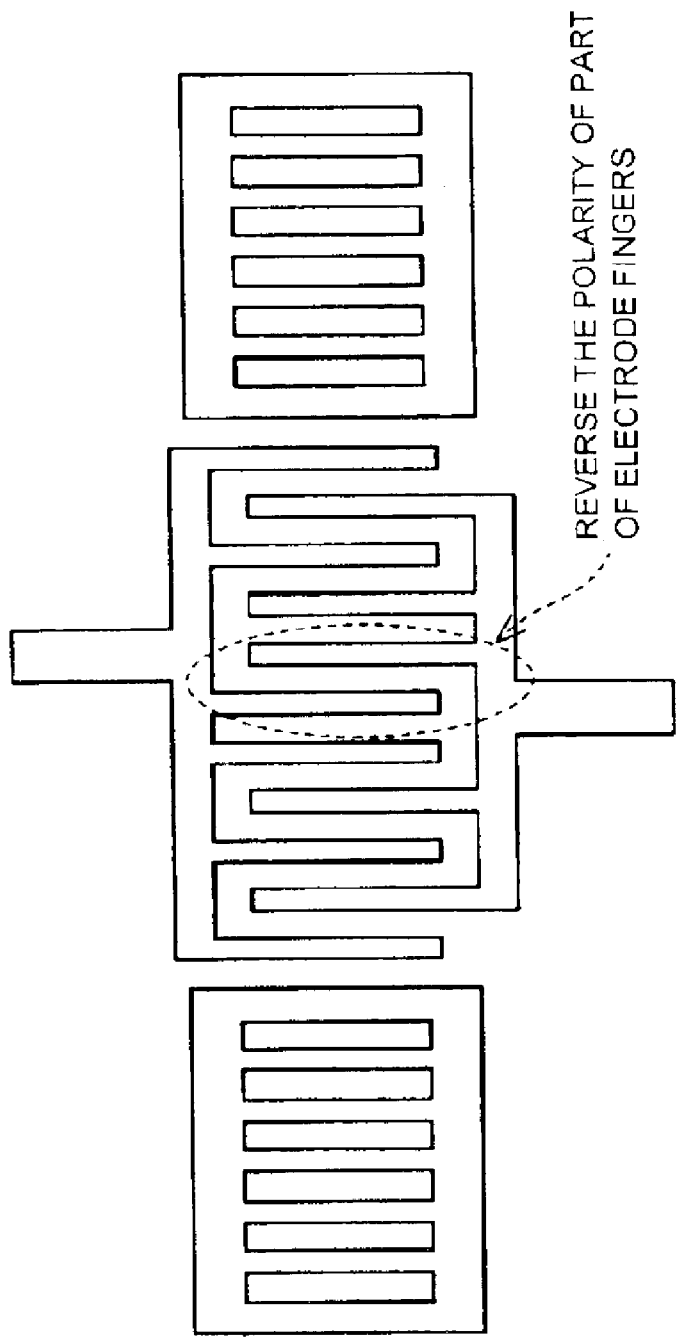
FIG. 25 is a schematic view of the IDT of the known SAW filter, another example of a thinned electrode being shown.
Figure 26:
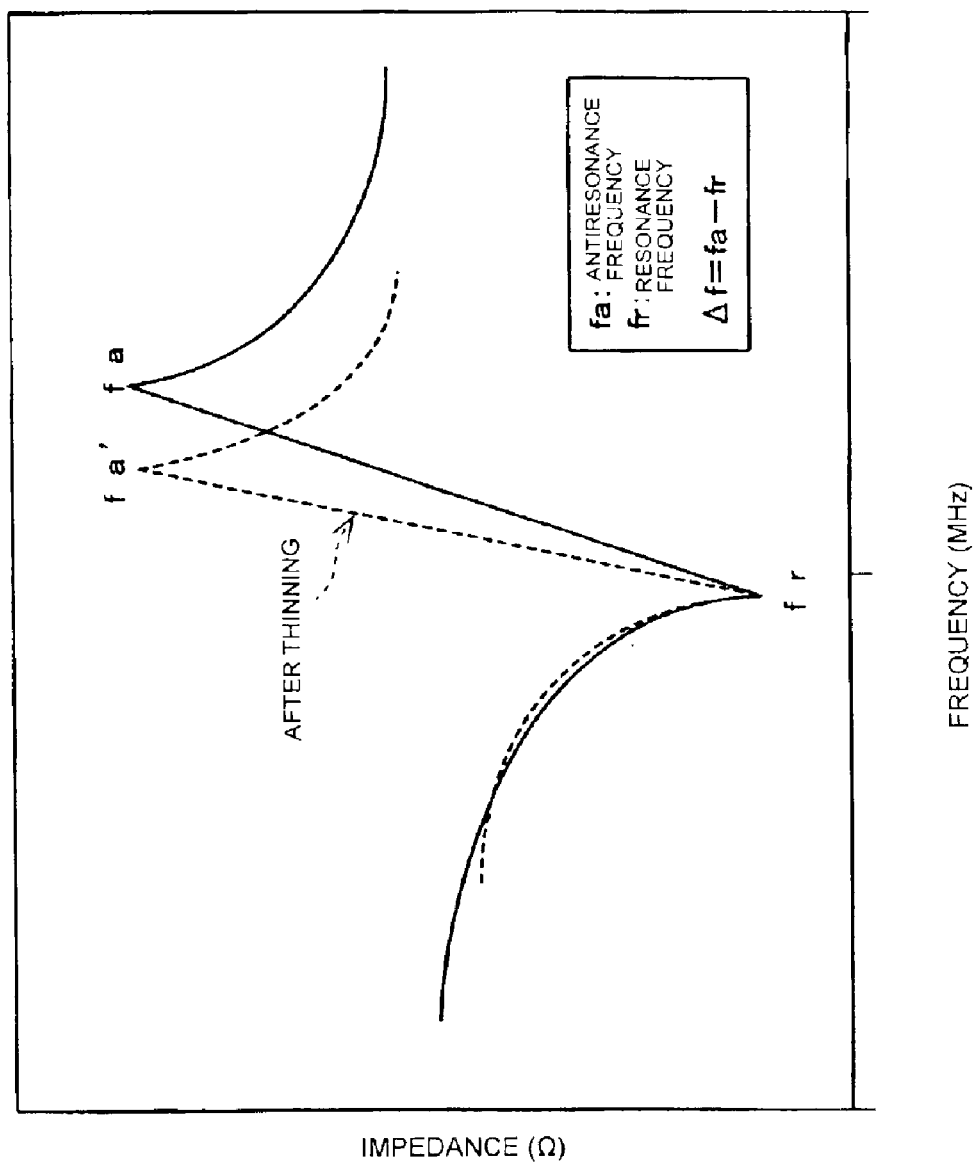
FIG. 26 is a graph showing a variation in the frequency characteristic of impedance in the known SAW filter, the variation being caused by thinning.
Figure 27:
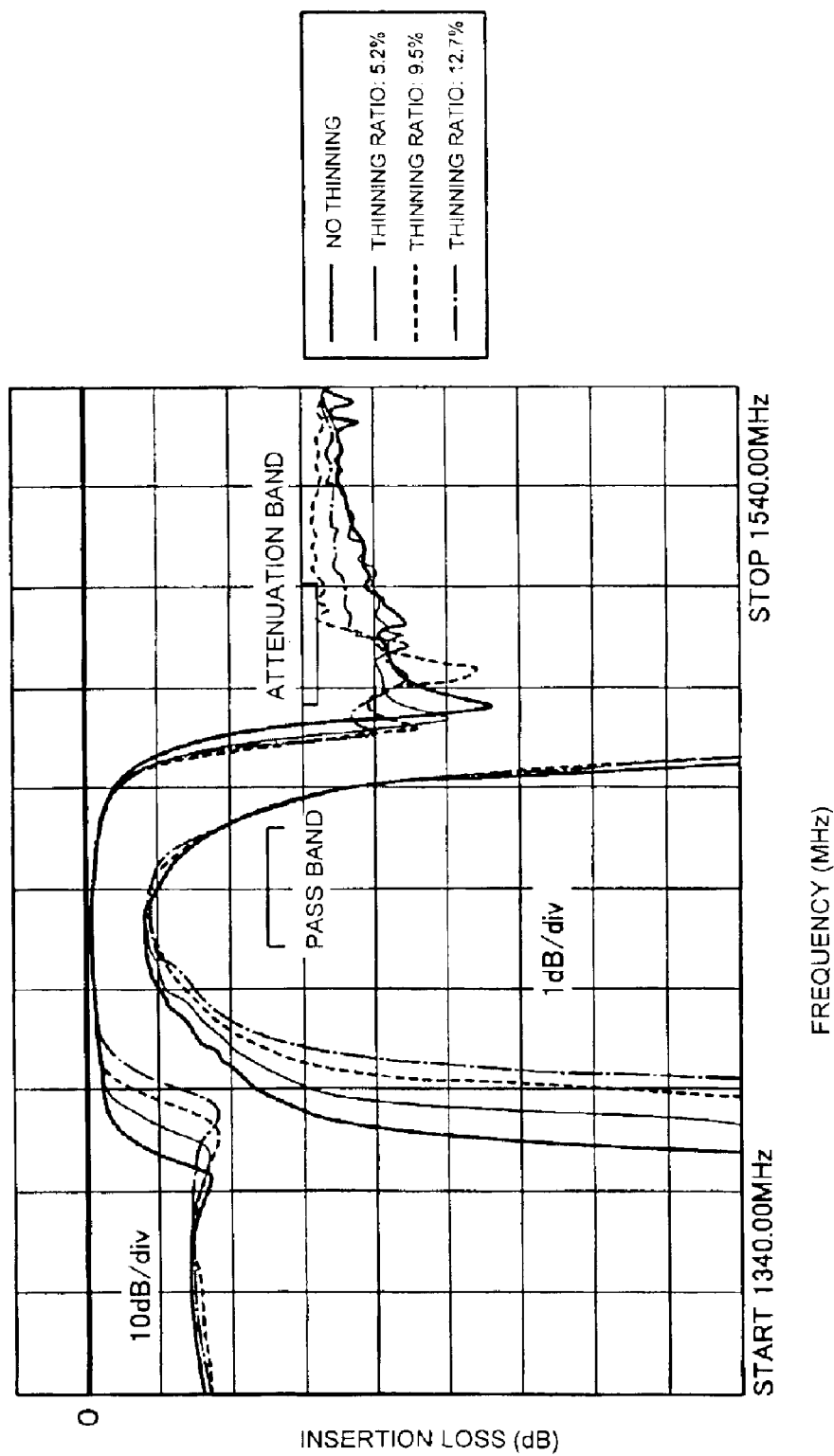
FIG. 27 is a graph showing the frequency characteristic of insertion loss in the known SAW filter, in which the thinning ratio is changed.

A method of reversing polarity shown in FIG. 25 is used in order to thin the electrode. Preferably, thinning is not performed at regular intervals, but the thinning ratio gradually increases from the left to the right of the IDT electrode (increases with distance from the parallel resonators 112a and 112b).

Figure 3:
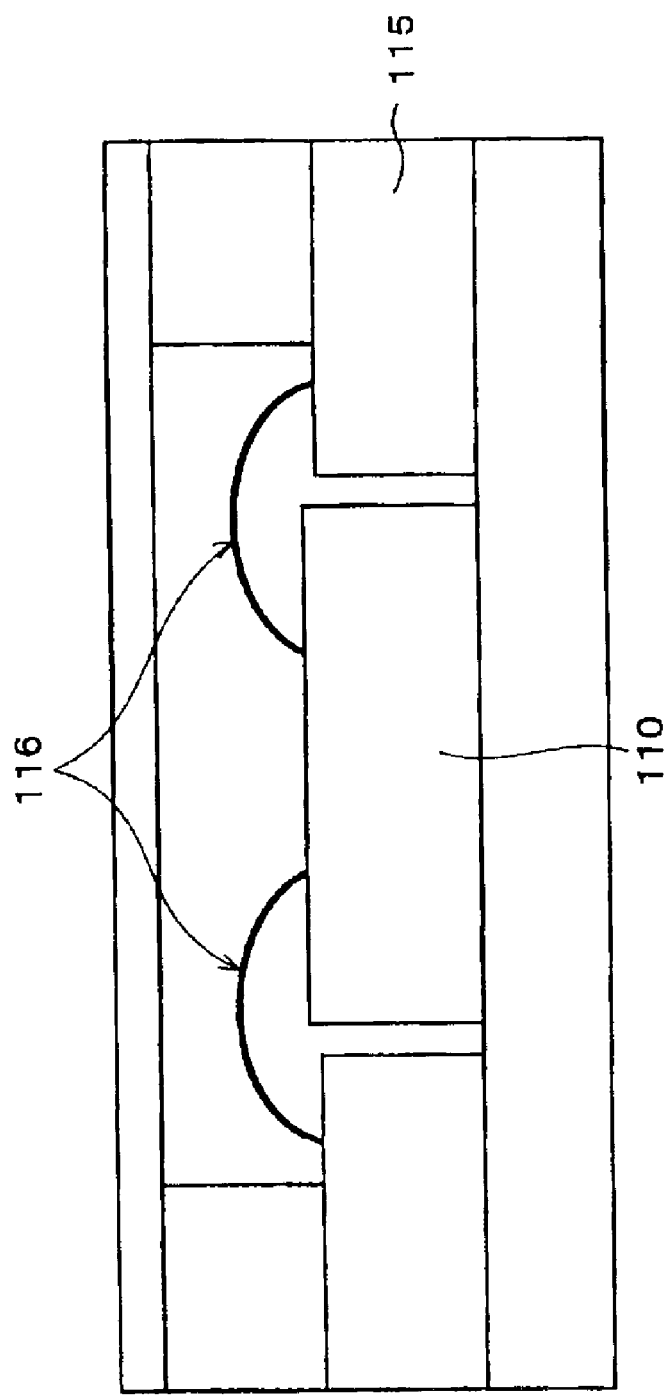
FIG. 3 is a cross-sectional view showing a state where the SAW filter is accommodated in a package.

Each of the input terminal 113a and the output terminal 113b is configured in a substantially rectangular pad shape. Likewise, each of ground terminals 114a and 114b connected to the parallel resonators 112a and 112b is configured in a substantially rectangular pad shape. As shown in FIG. 3, the electrodes are electrically connected to a package 115 via bonding wires 116.

Tables 1 and 2 show the relationship between the thinning ratio and the electrode pitch of the series resonators 111a to 111c. In a prototype A1 (within the scope of the present invention), both of the thinning ratio and the electrode pitch of the series resonator 111b differ from those of the series resonators 111a and 111c. In a prototype B1 (within the scope of the present invention), the thinning ratio is the same in all the series resonators 111a to 111c, whereas the electrode pitch of the series resonator 111b differs from that of the series resonators 111a and 111c. In a prototype C1 (within the scope of the present invention), the conditions are the same as those in the prototype B1, except that the electrode pitch of the series resonator 111b is changed. In a prototype D1 (first comparative example), the electrode pitch is the same in all the series resonators 111a to 111c, whereas the thinning ratio of the series resonator 111b differs from that of the series resonators 111a and 111c. In a prototype E1 (second comparative example), both of the thinning ratio and the electrode pitch are the same in all the series resonators 111a to 111c.

TABLE 1

|  | Prototype A1 | Prototype B1 | Prototype C1 |
| --- | --- | --- | --- |
| Thinning ratio | 111a and 111c: 5.20% 111b: 12.70% | 111a and 111c: 5.20% 111b: 5.20% | 111a and 111c: 5.20% 111b: 5.20% |

TABLE 1-continued

|  | Prototype A1 | Prototype B1 | Prototype C1 |
| --- | --- | --- | --- |
| Electrode pitch | 111a and 111c: 1.3657 μm 111b: 1.3484 μm | 111a and 111c: 1.3657 μm 111b: 1.3484 μm | 111a and 111c: 1.3657 μm 111b: 1.3575 μm |

TABLE 2

|  | Prototype D1 | Prototype E1 |
| --- | --- | --- |
| Thinning ratio | 111a and 111c: 5.20% 111b: 12.70% | 111a and 111c: 5.20% 111b: 5.20% |
| Electrode pitch | 111a and 111c: 1.3657 μm 111b: 1.3657 μm | 111a and 111c: 1.3657 μm 111b: 1.3657 μm |

In the prototype A1, the thinning ratio and the electrode pitch are optimized so that a favorable attenuation characteristic and reflection characteristic (voltage standing wave ratio (VSWR)) are achieved. On the other hand, in the prototype B1, the thinning ratio is the same in all the series resonators and only the electrode pitch is optimized so as to achieve a favorable reflection characteristic. Also, in the prototype C1, the thinning ratio is the same in all the series resonators and only the electrode pitch is optimized so as to obtain a favorable attenuation characteristic. The prototype D1 is the first comparative example in which the electrode pitch is the same in all the series resonators, however, the thinning ratio of the series resonator 111b differs from that of the series resonators 111a and 111c. The prototype E1 is the second comparative example in which both of the thinning ratio and the electrode pitch are the same in all the series resonators.

Figure 4:
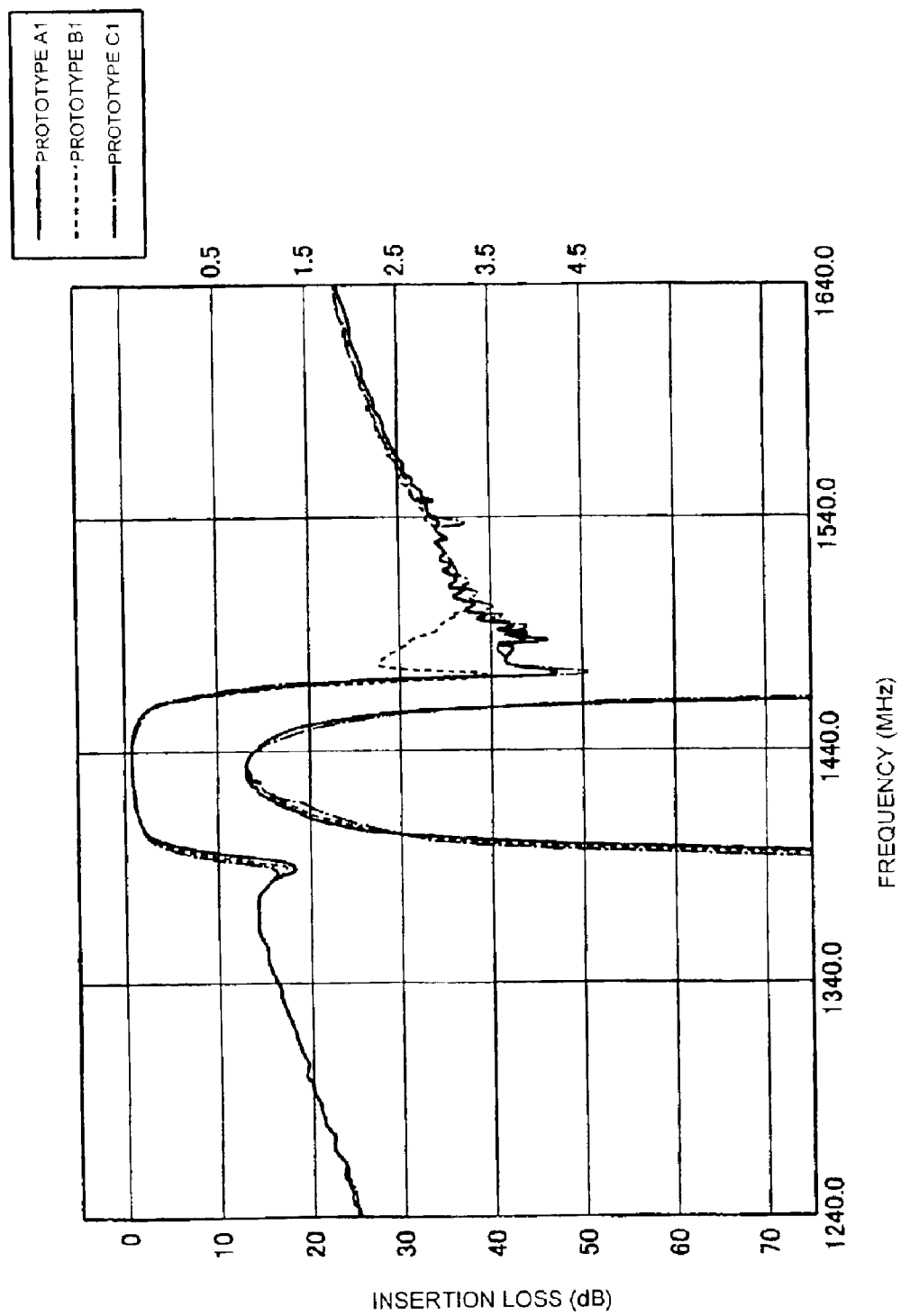
FIG. 4 is a graph showing the frequency characteristic of insertion loss of prototypes A1, B1, and C1 of the SAW filter.
Figure 5:
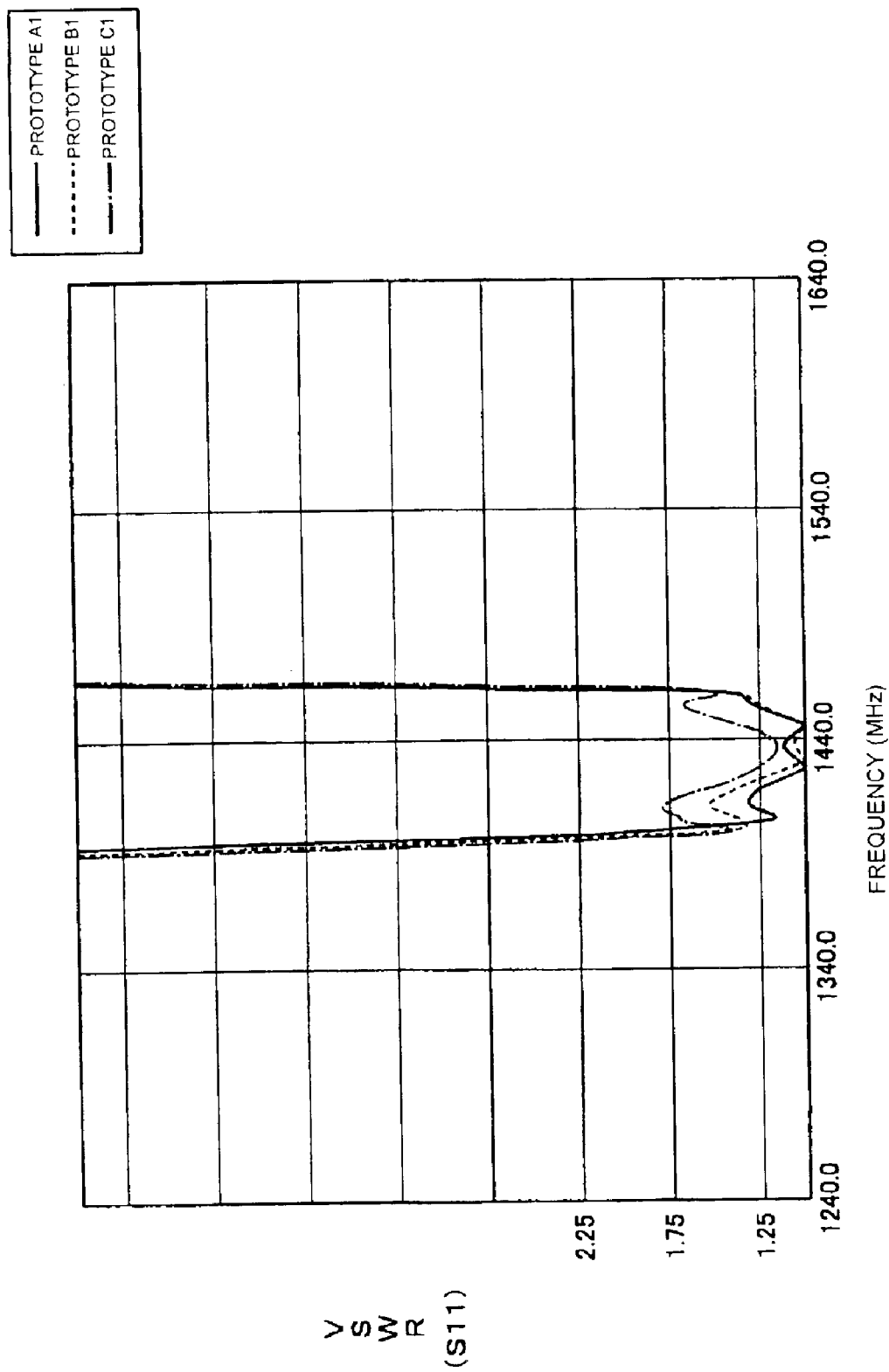
FIG. 5 is a graph showing the frequency characteristic of VSWR of S11 of the prototypes A1, B1, and C1 of the SAW filter.
Figure 6:
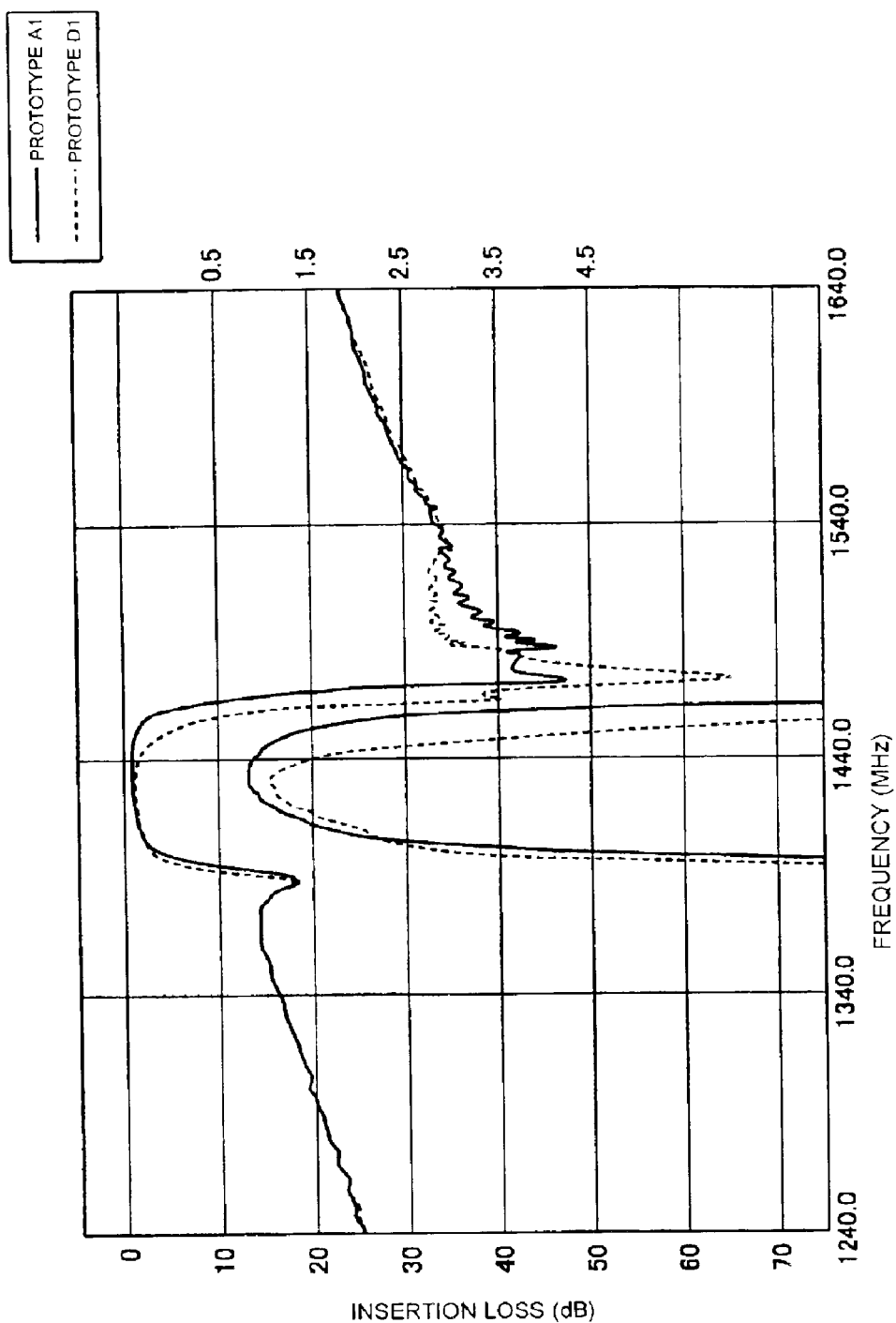
FIG. 6 is a graph showing the frequency characteristic of insertion loss of prototypes A1 and D1 of the SAW filter.
Figure 7:
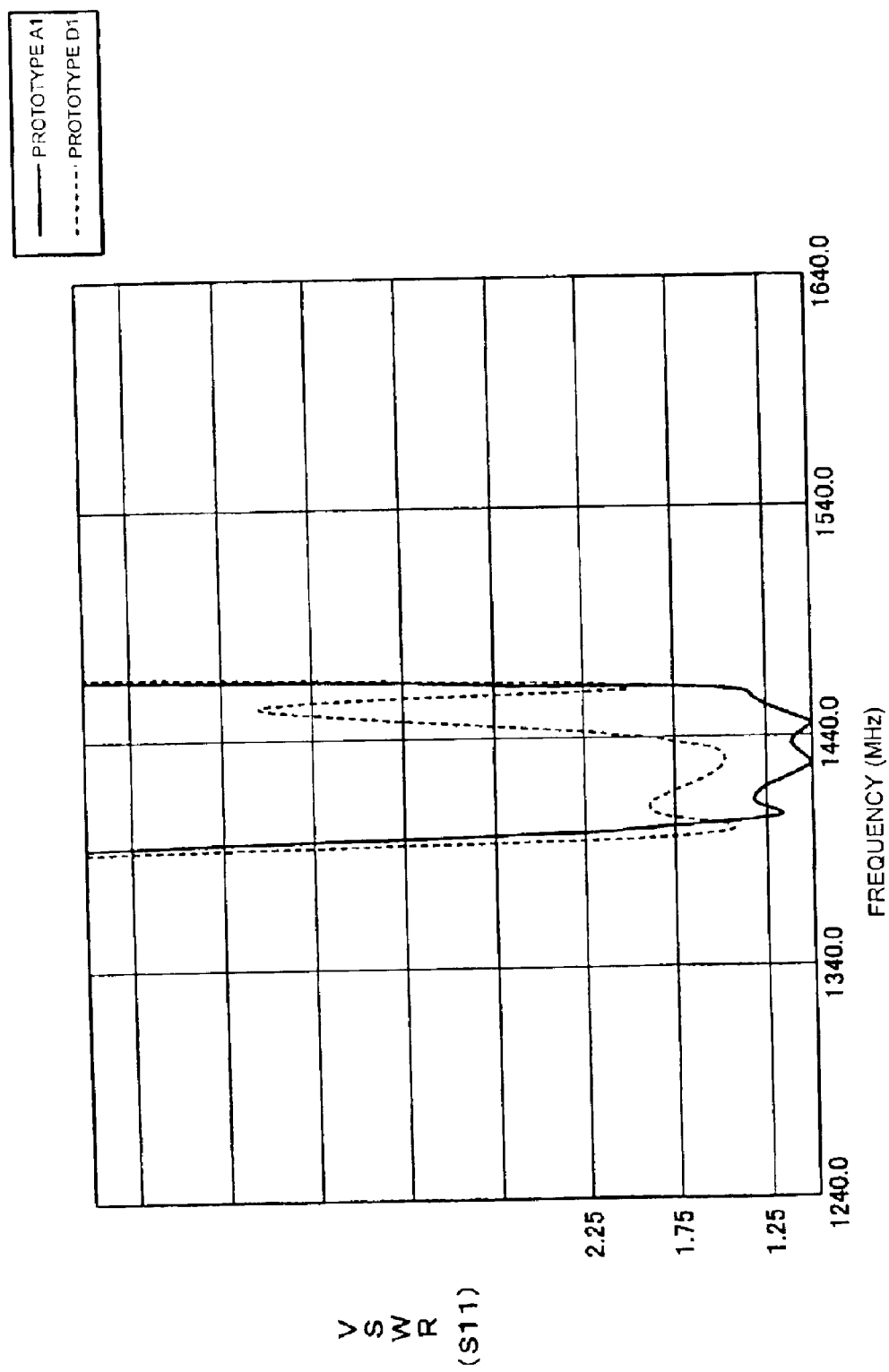
FIG. 7 is a graph showing the frequency characteristic of VSWR of S11 of the prototypes A1 and D1 of the SAW filter.

The electrical characteristic of each of the prototypes A1 to E1 is shown in FIGS. 4 to 9. FIGS. 6 and 7 show comparative data of the prototype D1, in which the electrode pitch is the same in all the series resonators but the thinning ratio of the series resonator 111b differs from that of the series resonators 111a and 111c. As is clear from FIGS. 6 and 7, the following is understood by comparing the prototype A1 with the prototype D1. That is, in the prototype D1, the pass band is narrower, the rise in the attenuation band is greater, and the reflection characteristic (VSWR) is worse than in the prototype A1. Accordingly, the effectiveness of changing the electrode pitch is clearly illustrated.

Figure 8:
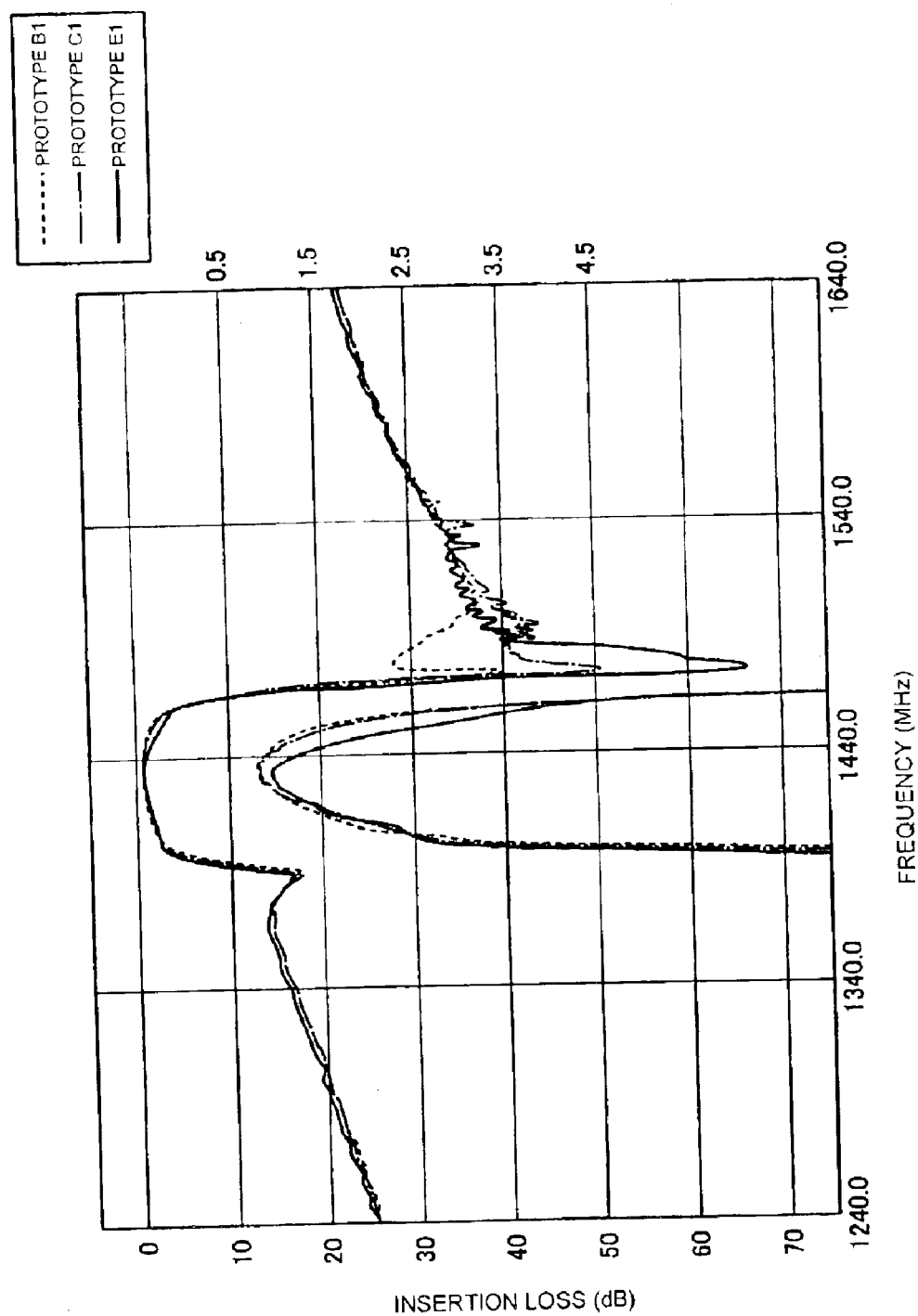
FIG. 8 is a graph showing the frequency characteristic of insertion loss of prototypes B1, C1, and E1 of the SAW filter.
Figure 9:
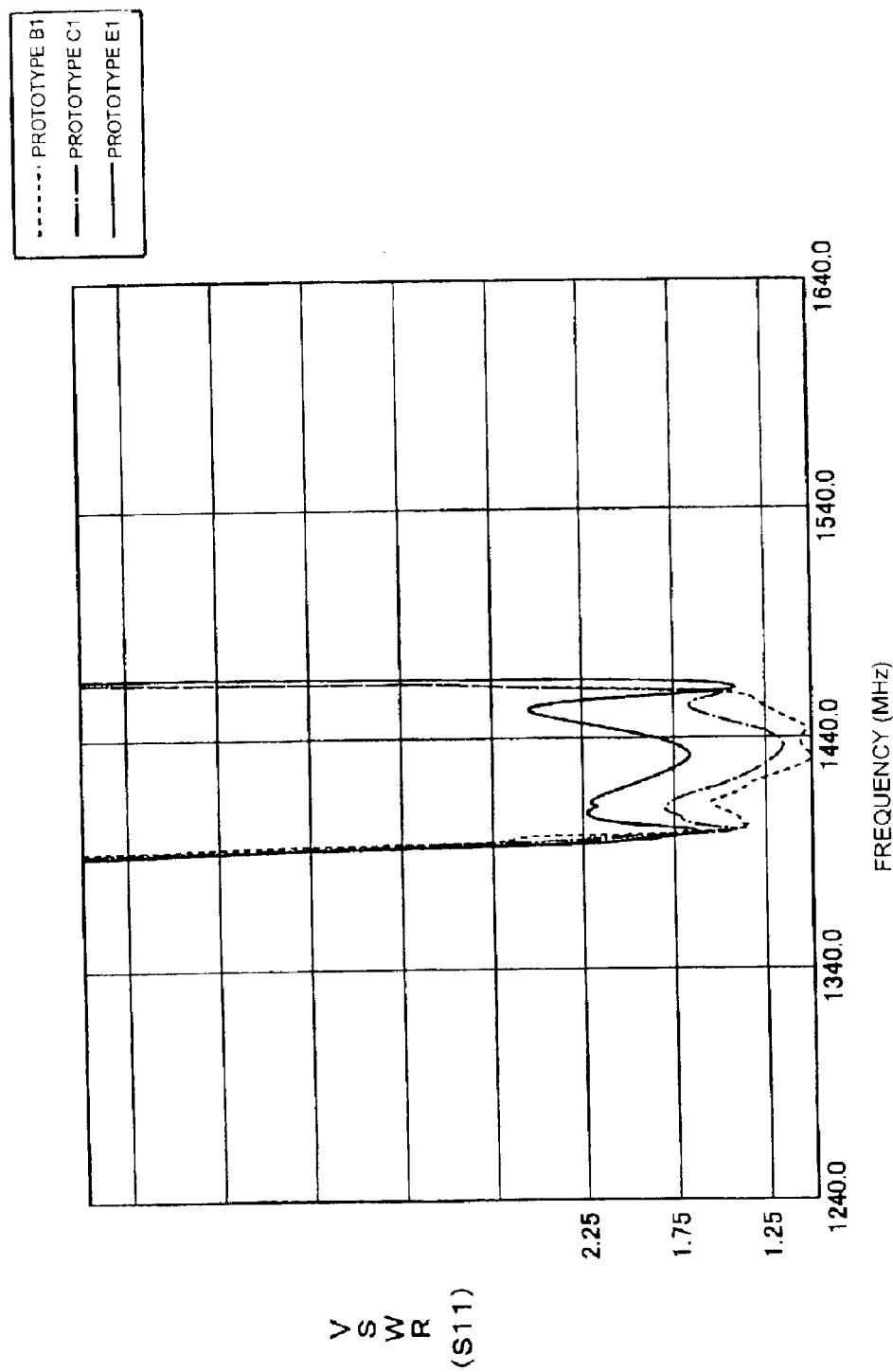
FIG. 9 is a graph showing the frequency characteristic of VSWR of S11 of the prototypes B1, C1, and E1 of the SAW filter.

Also, as can be seen in FIGS. 8 and 9, the prototypes B1 and C1, in which the electrode pitch is different, have a better reflection characteristic in the pass band as compared with that of the prototype E1 based on the known art. In this way, by adopting the configuration of various preferred embodiments of the present invention, in which the electrode pitch is different, a reflection characteristic is improved while applying thinning and increasing steepness.

FIGS. 4 and 5 show the comparison result of the prototypes A1, B1, and C1. In the prototype A1, the attenuation characteristic in the vicinity of the high-frequency side of the pass band and the reflection characteristic in the pass band are greatly improved. On the other hand, in the prototypes B1 and C1, one of the attenuation and reflection characteristics is worse than that of the prototype A1. The reason for this is as follows.

In the series resonators, a difference in resonance frequency of the resonators causes changes in the reflection characteristic. Also, a difference in antiresonance frequency of the resonators causes changes in the attenuation characteristic. In the prototype A1, the difference in resonance frequency corresponds to the difference in the electrode pitch. Also, the difference in antiresonance frequency corresponds to the difference in the thinning ratio. By optimizing the differences in the electrode pitch and the thinning ratio, greatly improved attenuation and reflection characteristics are achieved.

On the other hand, in the prototypes B1 and C1, the difference in only one of resonance frequency and antiresonance frequency is optimized. Therefore, one of attenuation and reflection characteristics is deteriorated.

In general, the optimal value of the difference in the electrode pitch of the resonators for ensuring an adequate attenuation bandwidth is different from the optimal value of the difference in the electrode pitch of the resonators for obtaining the best reflection characteristic. Therefore, higher priority must be given to one of the optimal values. In order to optimize both of the attenuation bandwidth and the reflection characteristic, both of the electrode pitch and the thinning ratio must be changed.

The reasons for using the T-shaped configuration and changing the electrode pitch and thinning ratio of the central series resonator 111$b$ in this preferred embodiment is as follows. In a method of designing a ladder filter, a combination of a series resonator and a parallel resonator defines one unit, and the number of stages is increased based on the unit so as to cascade resonators, as described in Japanese Unexamined Patent Application Publication No. 5-183380.

Accordingly, in the T-shaped configuration in which a series resonator is connected to each of input and output sides, an equivalent capacitance, which depends on the number of pairs of electrode fingers and the width of overlapping portion, of the central series resonator is less than that of the series resonators connected to the input and output sides. Further, the effect of attenuation characteristic which depends upon the capacitance is increased. Therefore, when the thinning ratio and the electrode pitch of the central series resonator 111$b$ are different from those of the series resonators in the input and output sides, the effect of the present invention achieves the most dramatic results.

Figure 10:
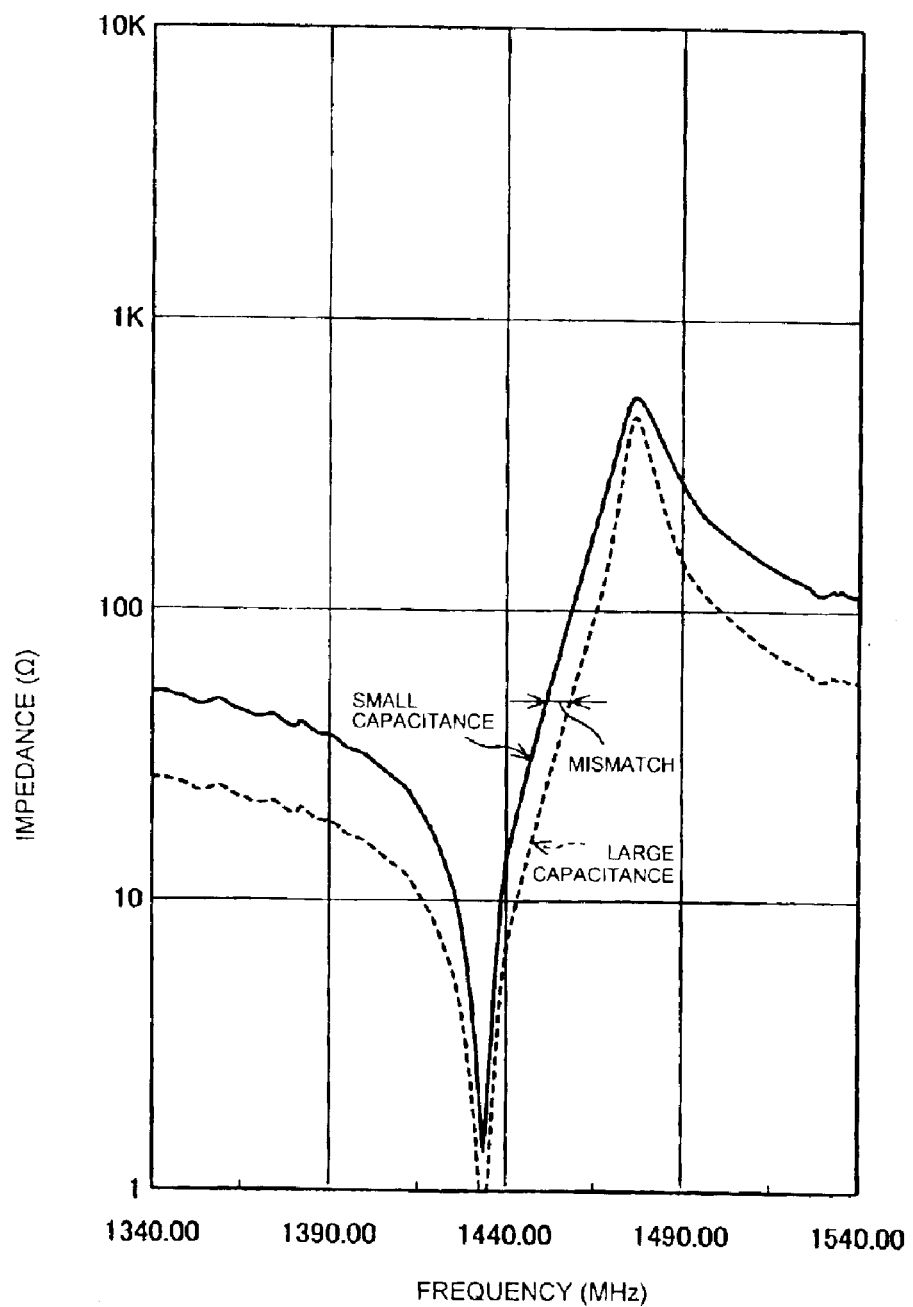
FIG. 10 is a graph showing the frequency characteristic of impedance in resonators in a comparative example, where mismatch of the resonators is caused.

In the prototype A1, the electrode pitch is less than and the thinning ratio is greater than in the series resonator 111$b$ as compared with the series resonators 111$a$ and 111$c$. The reason for this is as follows. As described above, the equivalent capacitance of the central series resonator 111$b$ is less than that of the series resonators 111$a$ and 111$c$, which are connected to the input and output sides. As shown in FIG. 10, when the resonators have a different capacitance, a mismatch is caused in the impedance characteristic between the resonance frequency and the antiresonance frequency.

Figure 11:
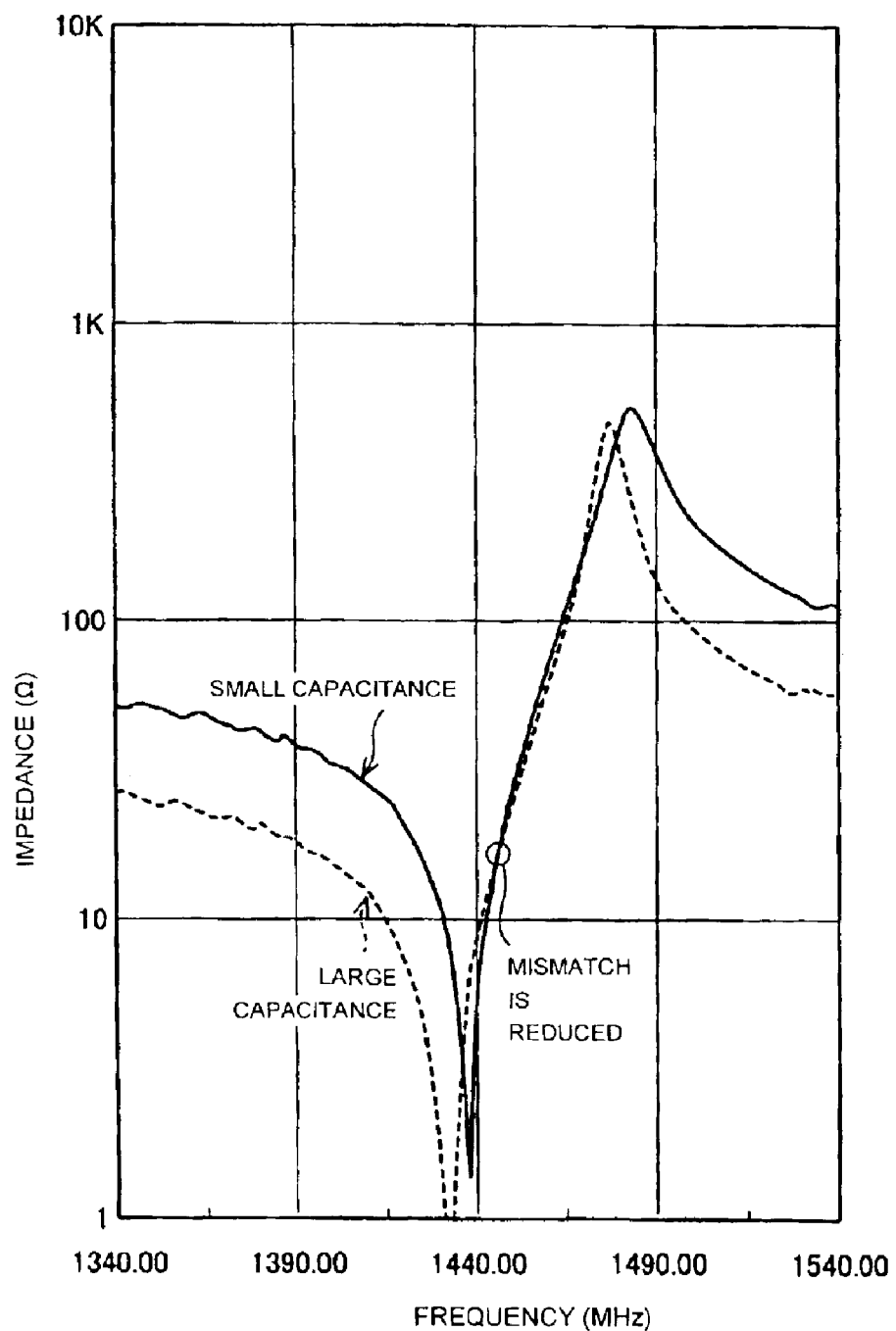
FIG. 11 is a graph showing the frequency characteristic of impedance in resonators in the first preferred embodiment, where mismatch of the resonators is reduced.

In this case, as shown in FIG. 11, by reducing the electrode pitch and increasing the frequency so as to eliminate the mismatch, the reflection characteristic is improved in that range. At this time, however, the frequency is increased and the difference in antiresonance frequency is increased, and thus, the attenuation characteristic is deteriorated. In order to overcome this problem, the thinning ratio is increased so as to adequately reduce the difference in antiresonance frequency. Accordingly, the attenuation characteristic is greatly improved.

Therefore, the effects of preferred embodiments of the present invention are enhanced by reducing the electrode pitch and increasing the thinning ratio in the central series resonator 111$b$. In particular, in the configuration according to the first preferred embodiment, a significant effect is obtained by setting the following conditions: the electrode pitch of the central series resonator 111$b$ is about 0.975 times less than that of the series resonators 111$a$ and 111$c$ (more preferably, the minimum is 0.980 times and the maximum is about 0.995 times), and the thinning ratio of the central series resonator 111$b$ is about 2.7 times greater than that of the series resonators 111$a$ and 111$c$ (more preferably, the minimum is about 2.0 times and the maximum is about 2.5 times).

As the capacitance of the central series resonator is reduced, the attenuation characteristic is improved, whereas the mismatch increases and the reflection characteristic is deteriorated. At this time, by providing the configuration according to preferred embodiments of the present invention, the reflection characteristic is significantly improved and a rise in the attenuation band is prevented. Thus, a favorable filter characteristic is obtained.

Figure 24:
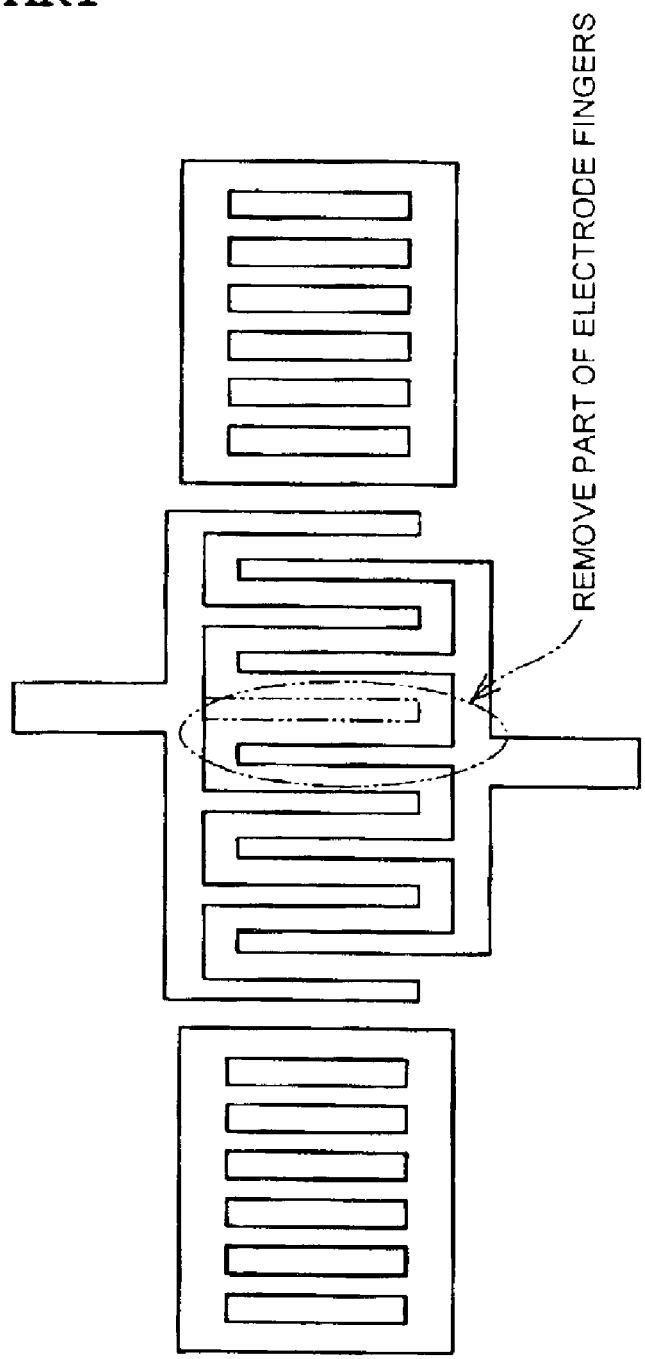
FIG. 24 is a schematic view of an IDT of the known SAW filter, an example of a thinned electrode being shown.

The thinning configuration of this preferred embodiment is not limited to the above-described configuration. Alternatively, the configuration shown in FIG. 24 may be used. That is, any configuration may be used as long as an electric field is not applied to a portion of the electrode fingers. Also, any range of the IDT electrode may be thinned regularly or irregularly. However, the above described manner of thinning is preferred.

In this preferred embodiment, the piezoelectric substrate comprises 36° rotated Y-cut X-propagation LiTaO$_3$. However, another material may also be used for the substrate. For example, a 38°–46° rotated Y-cut X-propagation LiTaO$_3$ substrate or a 64°–72° rotated LiNbO$_3$ substrate may be used.

Also, the method of forming an electrode is not limited to the method disclosed herein. For example, etching may be used instead of lift-off. Also, as a mounting method, a flip chip bonding may be used instead of wire bonding.

In the above-described ladder SAW filter, by thinning every series resonator and by setting the electrode pitch of at least one of the series resonators to be different from that of the other series resonators, the reflection characteristic in the pass band is greatly improved while increasing steepness. Further, by changing the thinning ratio, the attenuation characteristic in the vicinity of a high-frequency side of the pass band and the reflection characteristic in the pass band is greatly improved in a well-balanced manner. Accordingly, a compact SAW filter in which a reflection characteristic is greatly improved, loss is greatly reduced, and decompression characteristic is desirable as compared with the known art, is provided.

Further, by applying the T-shaped configuration in which a series resonator is connected to each of input and output sides and by setting the condition in which the thinning ratio and the electrode pitch of the central series resonator is different from those of the other series resonators, the effects of preferred embodiments of the present invention can be enhanced.

Specifically, the electrode pitch of the central series resonator is less than that of the other series resonators, and the thinning ratio of the central series resonator is greater than that of the other series resonators. With this arrangement, the effects of preferred embodiments of the present invention are further enhanced.

Second Preferred Embodiment

Figure 12:
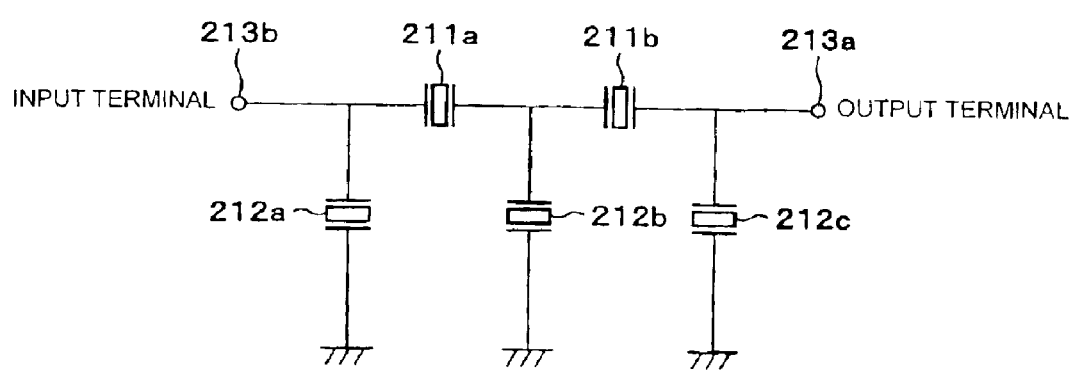
FIG. 12 is a circuit diagram of a SAW filter according to a second preferred embodiment of the present invention.
Figure 13:
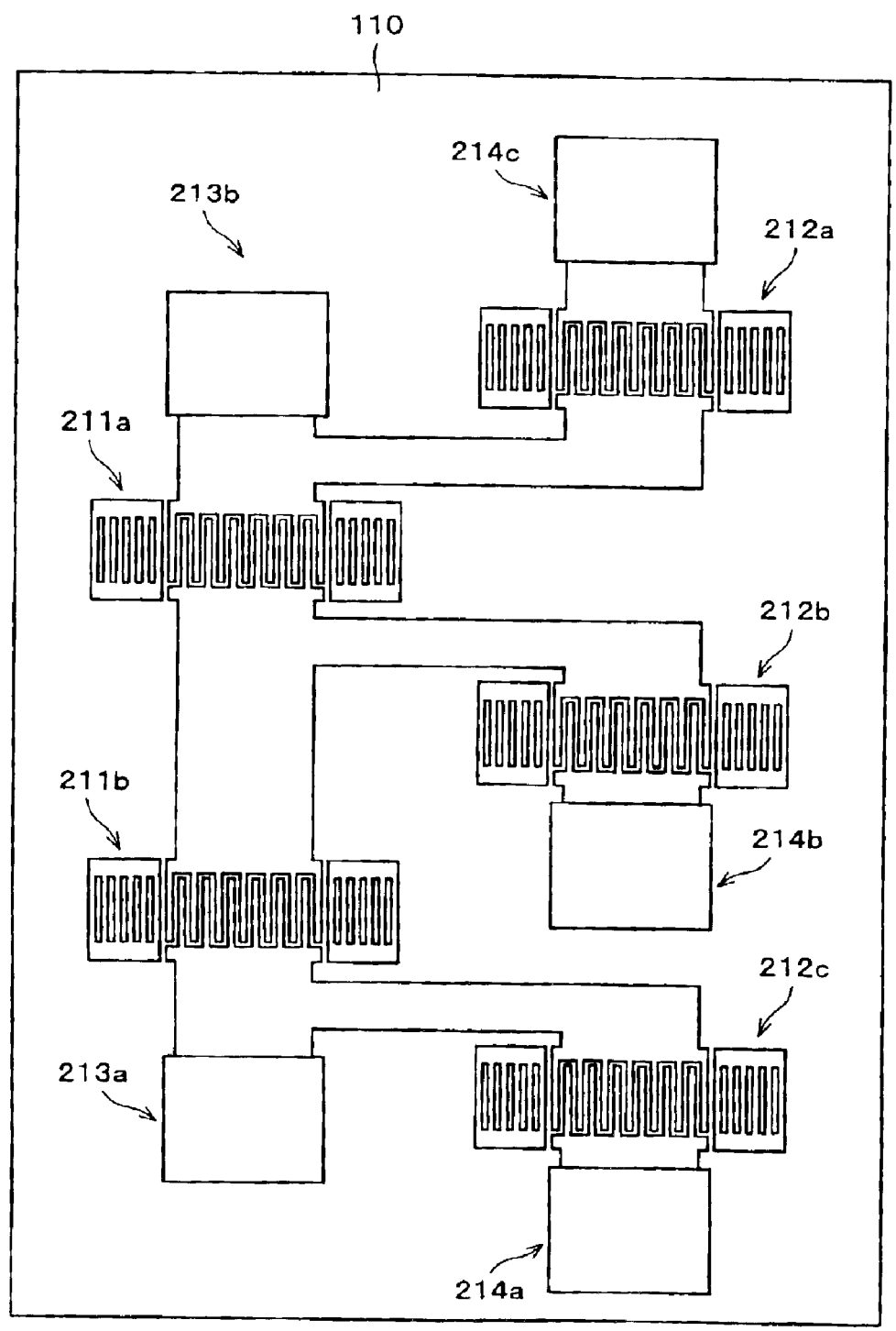
FIG. 13 is a schematic view showing the configuration of the SAW filter.

As a SAW filter of the second preferred embodiment, a ladder-type Rx filter in which the center frequency is 1489 MHz is used. FIG. 12 is a circuit diagram of the second preferred embodiment, and FIG. 13 is a schematic view showing IDT electrodes on the piezoelectric substrate 110. The SAW filter of this preferred embodiment includes parallel resonators 212a to 212c and series resonators 211a and 211b, which are arranged on the piezoelectric substrate 110 in a manner pursuant to the first preferred embodiment.

The SAW filter of this preferred embodiment preferably has a π-shaped configuration, in which the parallel resonator 212a is connected to the input side and the parallel resonator 212c is connected to the output side. Herein, the above-described configuration is referred to as a π-shaped configuration, in which the parallel resonators 212a and 212c should be connected to an input terminal 213b and an output terminal 213a respectively, but the combination of the other series and parallel resonators may be arranged in any suitable manner.

The parallel resonators 212a and 212c have the same configuration, that is, the width of overlapping portion of electrode fingers is about 58 μm, the number of effective pairs of electrode fingers of the IDT electrode is about 75, and the number of electrode fingers of reflectors is about 60. On the other hand, the parallel resonator 212b has a different configuration, that is, the width of overlapping portion of electrode fingers is about 85 μm, the number of effective pairs of electrode fingers of the IDT electrode is about 75, and the number of electrode fingers of reflectors is about 60. The series resonators 211a and 211b have the same configuration, that is, the width of overlapping portion of electrode fingers is about 36 μm, the number of pairs of electrode fingers of the IDT electrode is about 50, and the number of electrode fingers of reflectors is about 60.

The IDT electrode of each of the three parallel resonators 212a to 212c is thinned. As in the first preferred embodiment, the method of reversing a polarity shown in FIG. 25 is used in order to thin the electrode. Preferably, thinning is not performed at regular intervals, but the thinning ratio is gradually increased from the left to the right of the IDT electrode (is increased with distance from the series resonators 211a and 211b).

Each of the input terminal 213b and the output terminal 213a is configured in a pad shape. Also, each of the ground terminals 214a to 214c is configured in a pad shape. The thinning method, the method of forming the piezoelectric substrate 110 and the electrodes, and the method of electrically connecting the electrodes with the package are the same as in the first preferred embodiment.

Tables 3 and 4 show the relationship between the thinning ratio and the electrode pitch of the parallel resonators 212a to 212c. In a prototype A2 (within the scope of the present invention), both of the thinning ratio and the electrode pitch of the parallel resonator 212b differ from those of the parallel resonators 212a and 212c. In a prototype B2 (within the scope of the present invention), the thinning ratio is the same in all the parallel resonators 212a to 212c, whereas the electrode pitch of the parallel resonator 212b differs from that of the parallel resonators 212a and 212c. In a prototype C2 (within the scope of the present invention), the conditions are the same as those in the prototype B2, except that the electrode pitch of the parallel resonator 212b is changed. In a prototype D2 (third comparative example), the electrode pitch is the same in all the parallel resonators 212a to 212c, whereas the thinning ratio of the parallel resonator 212b differs from that of the parallel resonators 212a and 212c. In a prototype E2 (fourth comparative example), both of the thinning ratio and the electrode pitch are the same in all the parallel resonators 212a to 212c.

TABLE 3

|  | Prototype A2 | Prototype B2 | Prototype C2 |
| --- | --- | --- | --- |
| Thinning ratio | 212a and 212c: 6.25%<br>212b: 9.60% | 212a and 212c: 6.25%<br>212b: 6.25% | 212a and 212c: 6.25%<br>212b: 6.25% |
| Electrode pitch | 212a and 212c: 1.3647 μm<br>212b: 1.3573 μm | 212a and 212c: 1.3647 μm<br>212b: 1.3573 μm | 212a and 212c: 1.3647 μm<br>212b: 1.3610 μm |

TABLE 4

|  | Prototype D2 | Prototype E2 |
| --- | --- | --- |
| Thinning ratio | 212a and 212c: 6.25%<br>212b: 9.60% | 212a and 212c: 6.25%<br>212b: 6.25% |
| Electrode pitch | 212a and 212c: 1.3647 μm<br>212b: 1.3647 μm | 212a and 212c: 1.3647 μm<br>212b: 1.3647 μm |

In the prototype A2, the thinning ratio and the electrode pitch are optimized such that a favorable attenuation characteristic and reflection characteristic are achieved. On the other hand, in the prototype B2, the thinning ratio is the same in all of the parallel resonators and only the electrode pitch is optimized so as to obtain a favorable reflection characteristic. Also, in the prototype C2, the thinning ratio is the same in all the parallel resonators and only the electrode pitch is optimized so as to obtain a favorable attenuation characteristic. The prototype D2 is the third comparative example in which the electrode pitch is the same in all of the parallel resonators but the thinning ratio of the parallel resonator 212b differs from that of the parallel resonators 212a and 212c. The prototype E2 is the fourth comparative example based on the known art in which both of the thinning ratio and the electrode pitch are the same in all of the parallel resonators.

Figure 14:
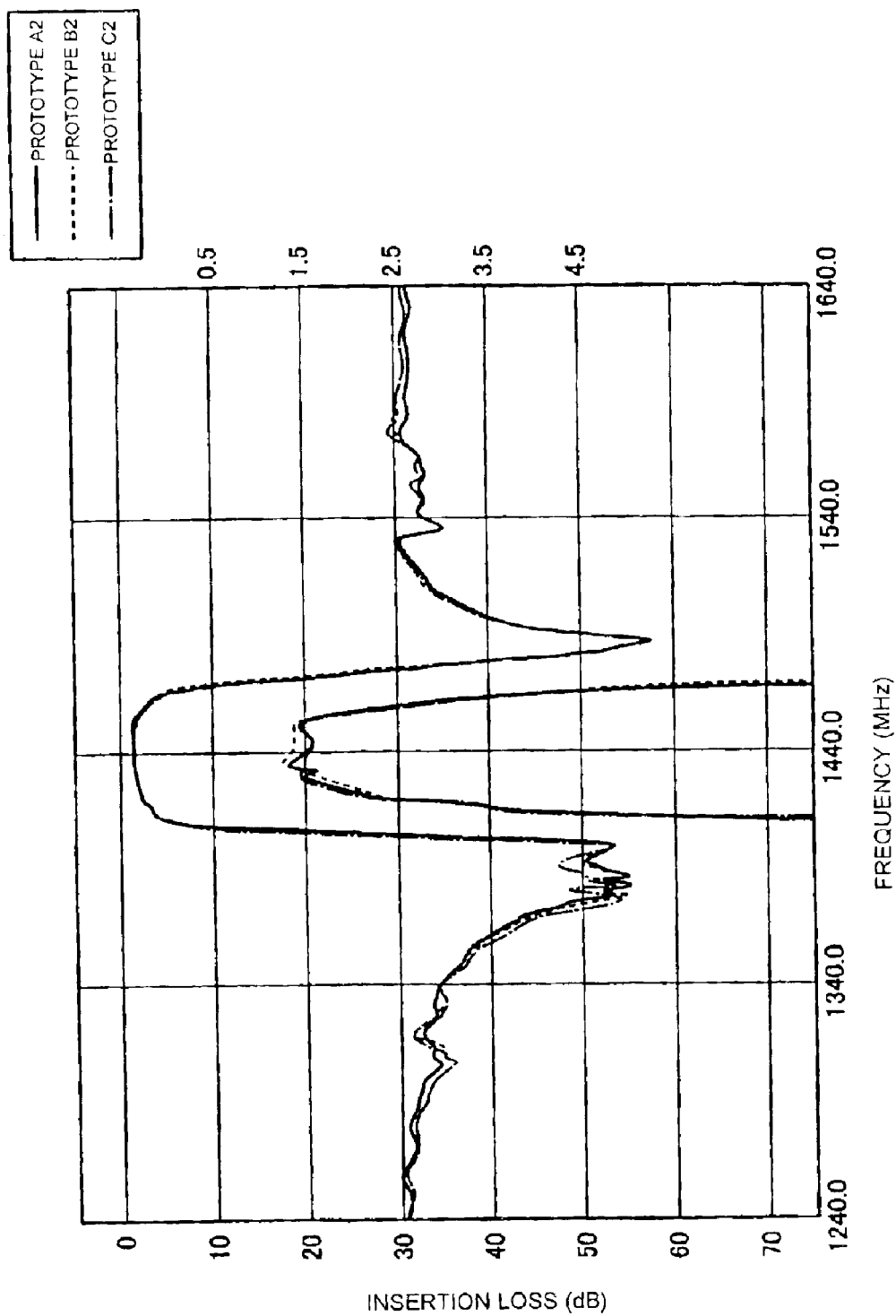
FIG. 14 is a graph showing the frequency characteristic of insertion loss of prototypes A2, B2, and C2 of the SAW filter.
Figure 15:
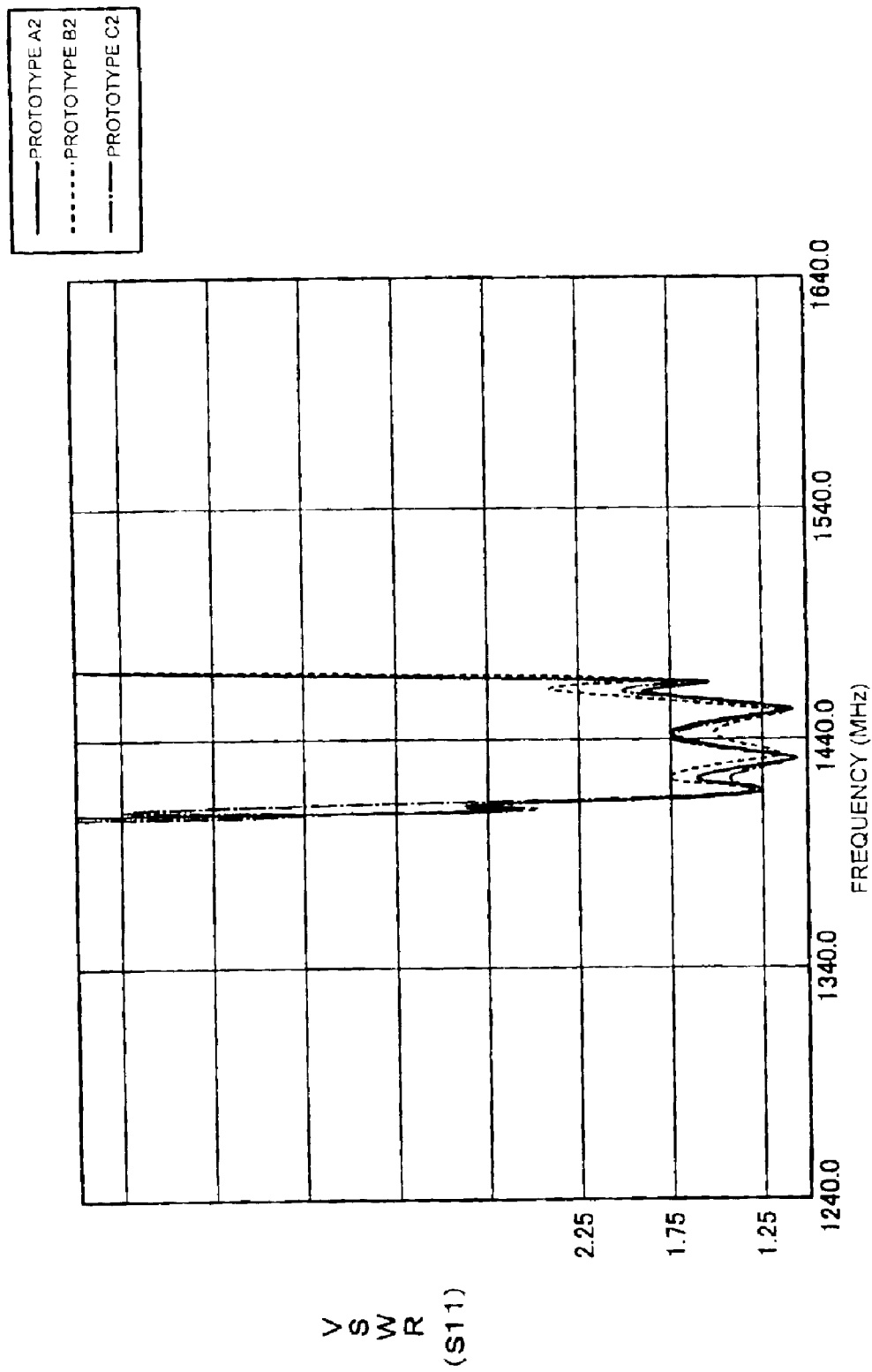
FIG. 15 is a graph showing the frequency characteristic of VSWR of S11 of the prototypes A2, B2, and C2 of the SAW filter.
Figure 16:
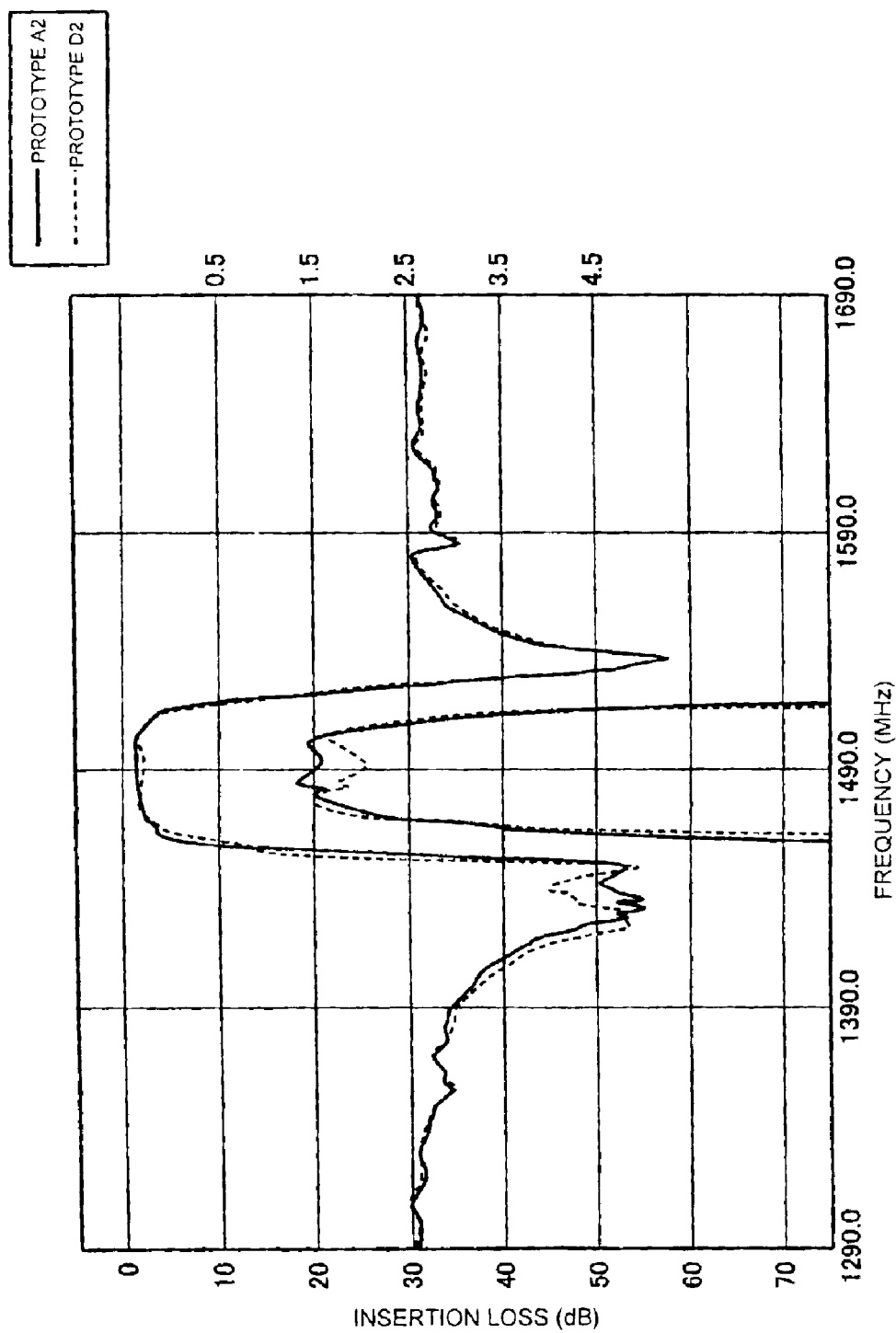
FIG. 16 is a graph showing the frequency characteristic of insertion loss of prototypes A2 and D2 of the SAW filter.
Figure 17:
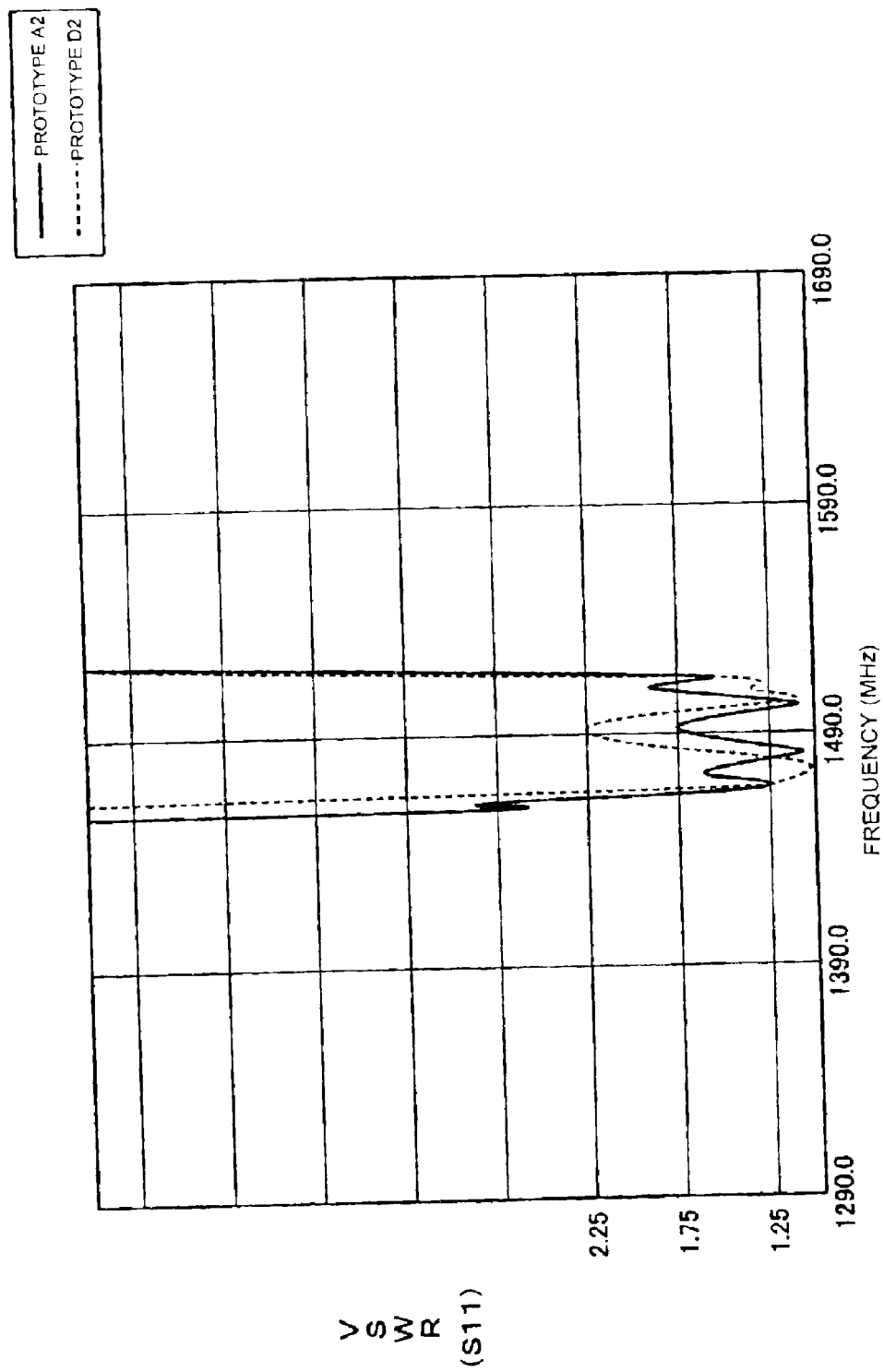
FIG. 17 is a graph showing the frequency characteristic of VSWR of S11 of the prototypes A2 and D2 of the SAW filter.

The electrical characteristic of each of the prototypes A2 to E2 is shown in FIGS. 14 to 19. FIGS. 16 and 17 show comparative data of the prototype D2, in which the electrode pitch is the same in all of the parallel resonators but the thinning ratio of the parallel resonator 212b differs from that of the parallel resonators 212a and 212c. As is clear from FIGS. 16 and 17, the following is understood by comparing the prototype A2 with the prototype D2. That is, in the prototype D2, the reflection characteristic (VSWR) is worse than in the prototype A2. Accordingly, the effectiveness of changing the electrode pitch is clearly seen.

Figure 18:
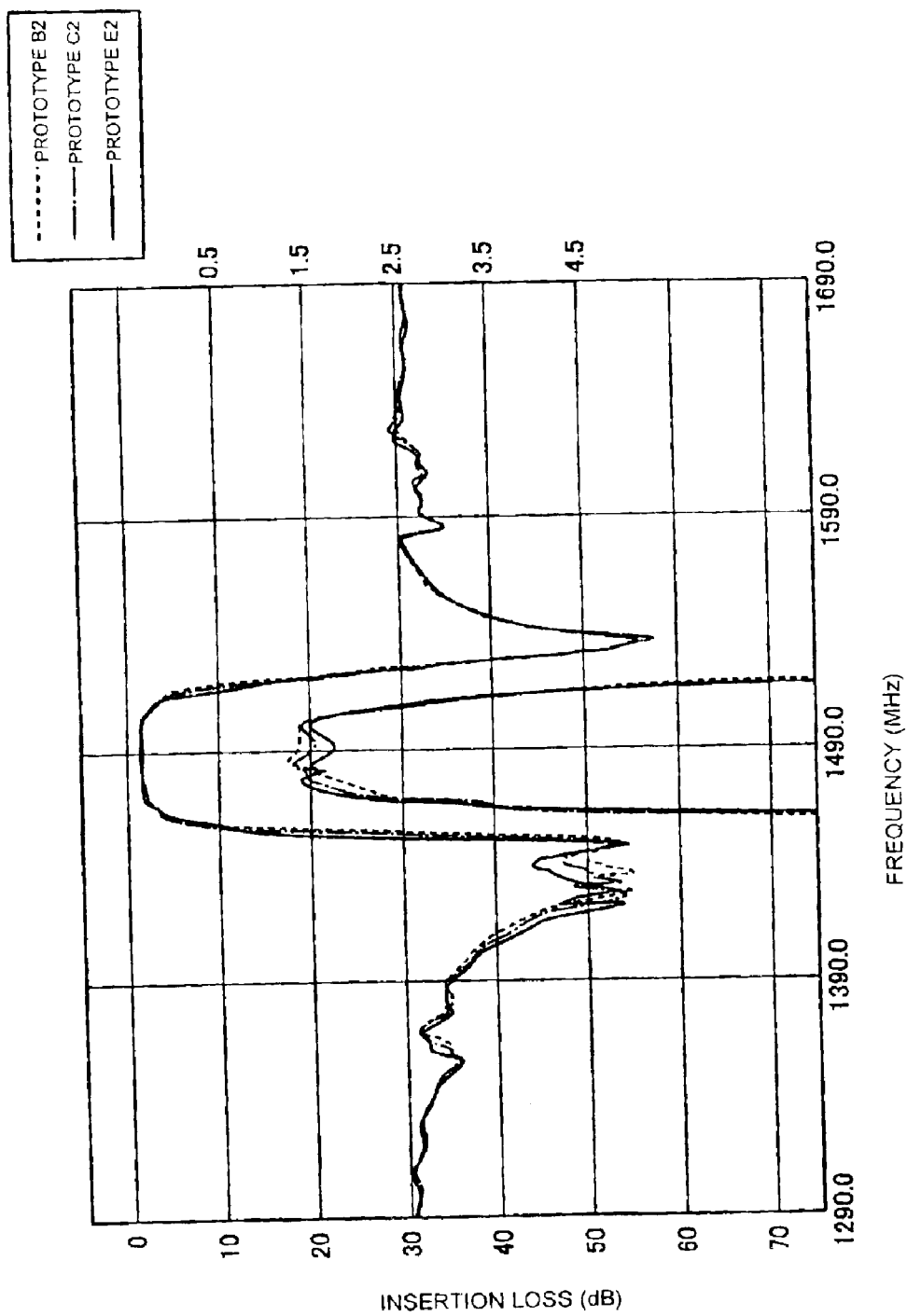
FIG. 18 is a graph showing the frequency characteristic of insertion loss of prototypes B2, C2, and E2 of the SAW filter.
Figure 19:
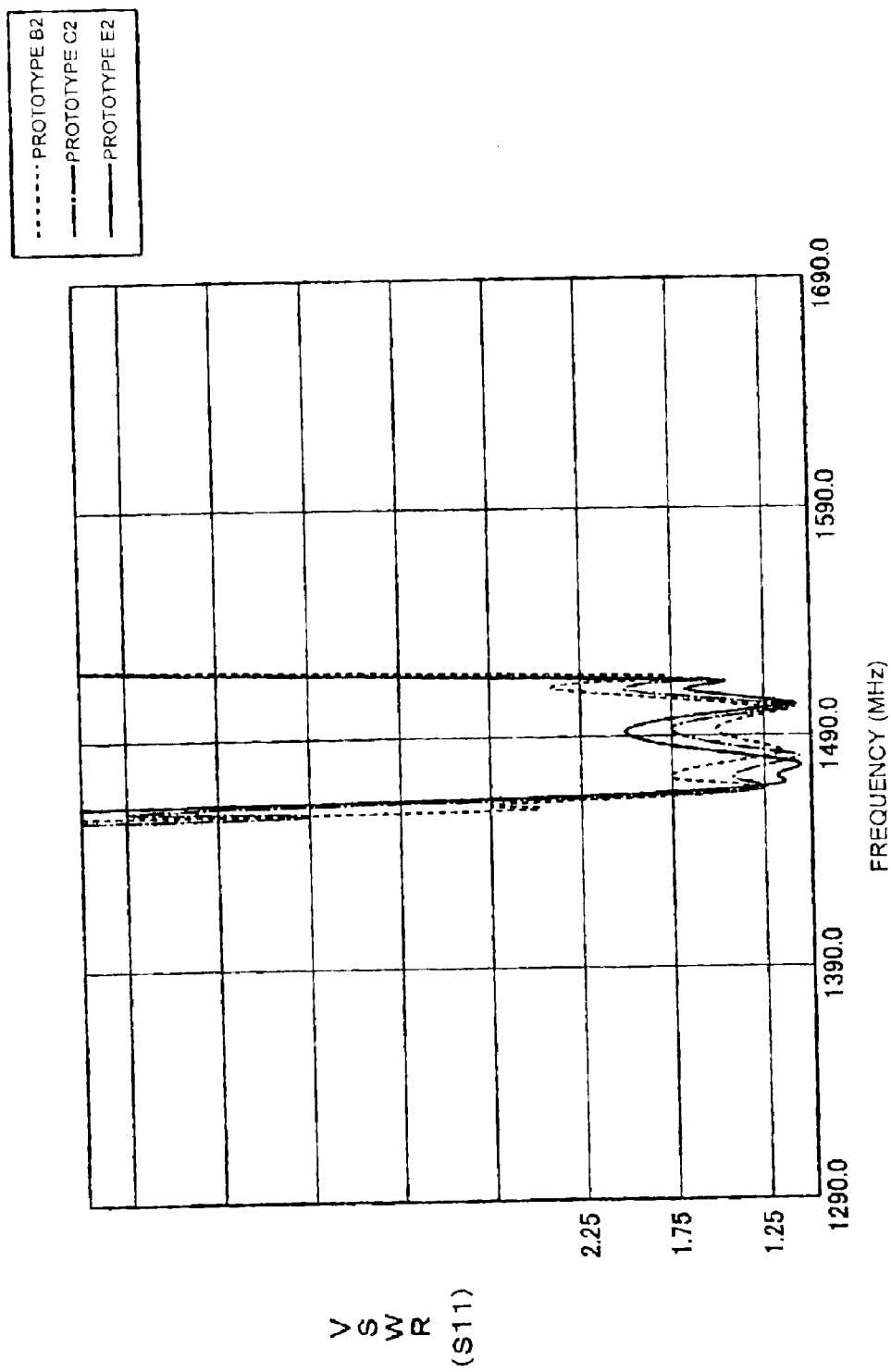
FIG. 19 is a graph showing the frequency characteristic of VSWR of S11 of the prototypes B2, C2, and E2 of the SAW filter.

As can be seen in FIGS. 18 and 19, the prototypes B2 and C2, in which the electrode pitch is different, have a better attenuation characteristic in the vicinity of a low-frequency side of the pass band as compared with that of the prototype E2 according to the fourth comparative example.

In this way, by adopting the configuration of preferred embodiments of the present invention, in which the electrode pitch is different, an attenuation characteristic is greatly improved by performing thinning and increasing steepness.

FIGS. 14 and 15 show the results of a comparison of the prototypes A2, B2, and C2. As shown in FIGS. 14 and 15, in the prototype A2, the attenuation characteristic in the vicinity of the low-frequency side of the pass band and the reflection characteristic in the pass band are greatly improved. On the other hand, in the prototypes B2 and C2, one of the attenuation and reflection characteristics is worse than that of the prototype A2. The reason for this is as follows, which is similar to the first preferred embodiment.

In the parallel resonators, a difference in antiresonance frequency of the resonators is a factor in changing the reflection characteristic. Also, a difference in resonance frequency of the resonators is a factor in changing the attenuation characteristic. In the prototype A2, the difference in resonance frequency corresponds to the difference in the electrode pitch. Also, the difference in antiresonance frequency corresponds to the difference in the thinning ratio. By optimizing the differences in the electrode pitch and the thinning ratio, greatly improved attenuation and reflection characteristics are achieved.

In the second preferred embodiment, the n-shaped configuration is preferably used and the central parallel resonator 212b has conditions that are different from those of the other parallel resonators. This is because the equivalent capacitance of the central parallel resonator 212b is increased. The reason is fundamentally the same as in the first preferred embodiment, although the capacitance of the central resonator is greater in the second preferred embodiment.

In the prototype A2, the electrode pitch is reduced and the thinning ratio is increased in the parallel resonator 212b as compared with the parallel resonators 212a and 212c. The reason for this is as follows. As described above, the equivalent capacitance of the central parallel resonator 212b is greater than that of the parallel resonators 212a and 212c, which are connected to the input terminal 213b and the output terminal 213a, respectively. Thus, the central parallel resonator 212b is susceptible to parasitic inductance on a wire or package. The reason for this is as follows.

Figure 20:
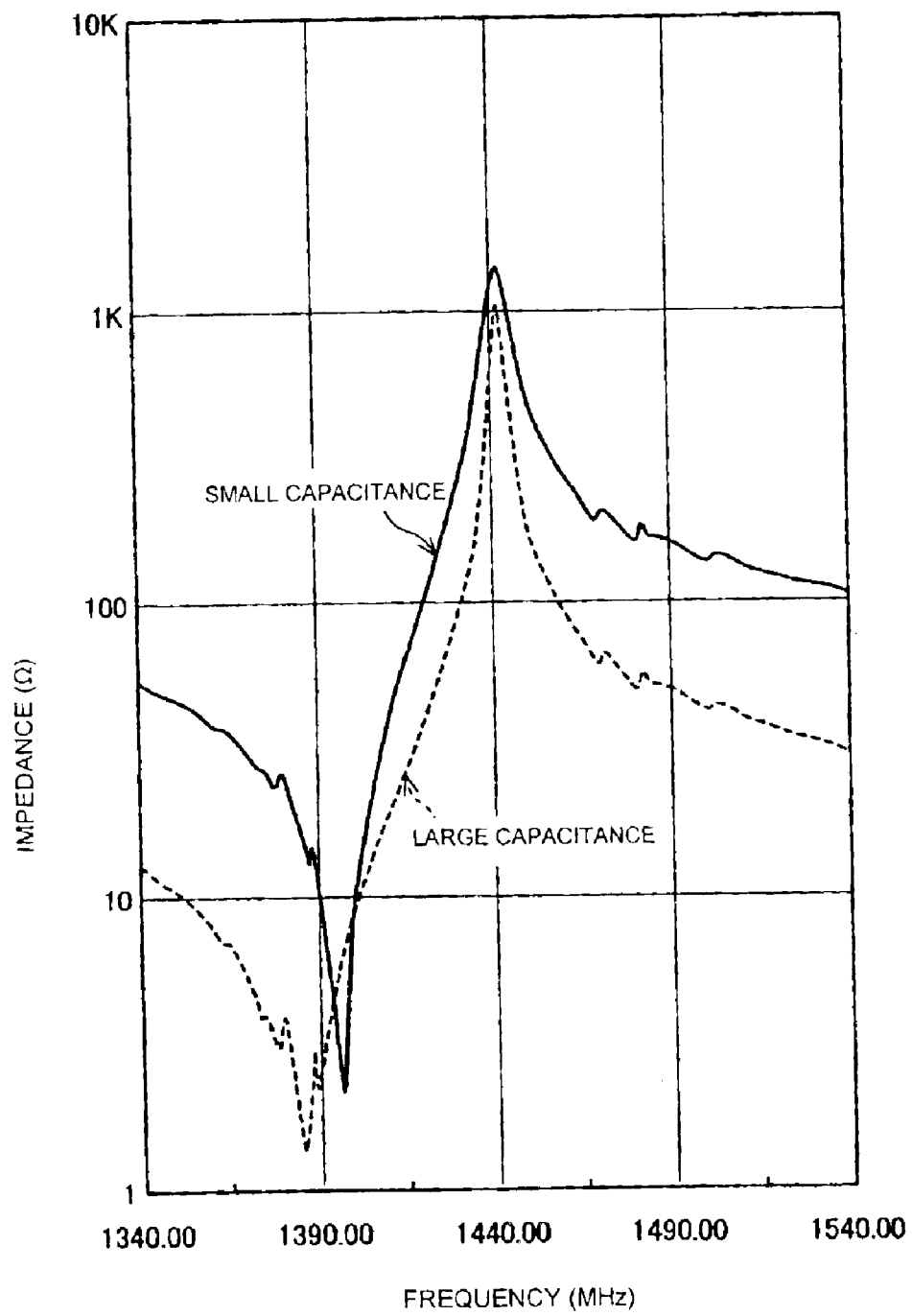
FIG. 20 is a graph showing the frequency characteristic of impedance in resonators in a comparative example, where mismatch of the resonators is caused.

As shown in FIG. 20, when inductances having the same value are connected in series, the resonance frequency of a resonator having a larger capacitance is shifted to the low-frequency side. Accordingly, the difference in the resonance frequency of the parallel resonators in the input/output sides and the central parallel resonator is increased, and thus the attenuation characteristic at the vicinity of the low-frequency side of the pass band is deteriorated. In order to adequately reduce the difference in the resonance frequency, the electrode pitch of the central parallel resonator is reduced so as to increase the frequency. Accordingly, the attenuation characteristic is greatly improved.

At this time, however, by increasing the frequency, a mismatch of the impedance characteristic is increased and the reflection characteristic is deteriorated. In order to overcome this problem, the thinning ratio is increased and the antiresonance frequency is shifted to the high-frequency side, such that the mismatch is reduced and the reflection characteristic is greatly improved.

The effects of preferred embodiments of the present invention are enhanced by reducing the electrode pitch and increasing the thinning ratio in the central parallel resonator 212b other than the parallel resonators 212a and 212c connected to the input terminal 213b and the output terminal 213a, respectively. In particular, in the second preferred embodiment, a significant effect is achieved by setting the following conditions: the electrode pitch of the central parallel resonator 212b is about 0.991 times less than that of the parallel resonators 212a and 212c (more preferably, the minimum is about 0.993 times and the maximum is about 0.998 times), and the thinning ratio of the central parallel resonator 212b is about 1.9 times greater than that of the parallel resonators 212a and 212c (more preferably, the minimum is about 1.3 times and the maximum is about 1.7 times).

As described above, in the ladder SAW filter, by thinning every parallel resonator and by setting the electrode pitch of at least one of the parallel resonators to be different from that of the other parallel resonators, the attenuation characteristic in the vicinity of the low-frequency side of the pass band is greatly improved while increasing the steepness.

Further, by changing the thinning ratio, the attenuation characteristic in the vicinity of the low-frequency side of the pass band and the reflection characteristic in the pass band is greatly improved in a well-balanced manner. Accordingly, a compact SAW filter in which a reflection characteristic is improved, loss is reduced, and a decompression characteristic is desirable as compared with the known art, is provided.

Further, by using the n-shaped configuration in which a parallel resonator is connected to each of the input and output sides and by setting the condition in which the thinning ratio and the electrode pitch of the central parallel resonator is different from those of the other parallel resonators, the effects of preferred embodiments of the present invention are greatly improved.

Specifically, the electrode pitch of the central parallel resonator is less than that of the other parallel resonators, and the thinning ratio of the central parallel resonator is greater than that of the other parallel resonators. With this arrangement, the effects of preferred embodiments of the present invention are further enhanced.

In the above described preferred embodiments, every resonator is preferably thinned. Alternatively, only some of the resonators may be thinned. However, it is preferable to perform thinning to all the resonators so as to improve the above-described characteristics.

Figure 21:
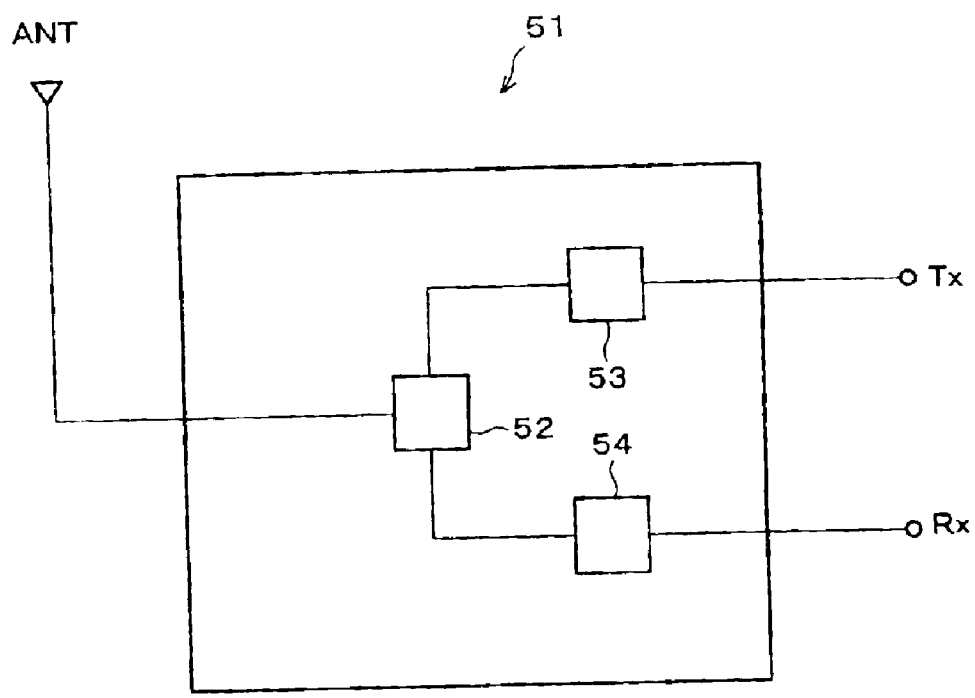
FIG. 21 is a circuit block diagram of a branching filter including the SAW filter according to preferred embodiments of the present invention.

FIG. 21 shows a duplexer according to another preferred embodiment of the present invention. The duplexer includes a matching circuit 52 connected to an antenna (ANT), a transmission filter 53 connected between the matching circuit 52 and a transmission terminal (Tx), and a reception filter 54 connected between the matching circuit 52 and a reception terminal (Rx). The transmission filter 53 and the reception filter 54 are set such that the pass band thereof is different from each other.

Preferably, the transmission filter 53 includes the prototype A1 described in the first preferred embodiment, and the reception filter 54 includes the prototype A2 described in the second preferred embodiment. By using the SAW filter of various preferred embodiments of the present invention for at least one of the transmission filter 53 and the reception filter 54, a duplexer having suppressed shouldering and a favorable filter characteristic is achieved. Suppressed shouldering means that the frequency interval required to attenuate the frequency at the upper or lower end of the pass band to a predetermined attenuation frequency is greatly reduced.

Next, a communication apparatus including the SAW filter of the above-described preferred embodiments will be described with reference to FIG. 22. The receiver side (Rx side) for performing reception of a communication apparatus 600 includes an antenna 601, a duplexer/RF top filter 602, an amplifier 603, an Rx interstage filter 604, a mixer 605, a 1st IF filter 606, a mixer 607, a 2nd IF filter 608, a 1st+2nd local synthesizer 611, a temperature compensated crystal oscillator (TCXO) 612, a divider 613, and a local filter 614.

Figure 22:
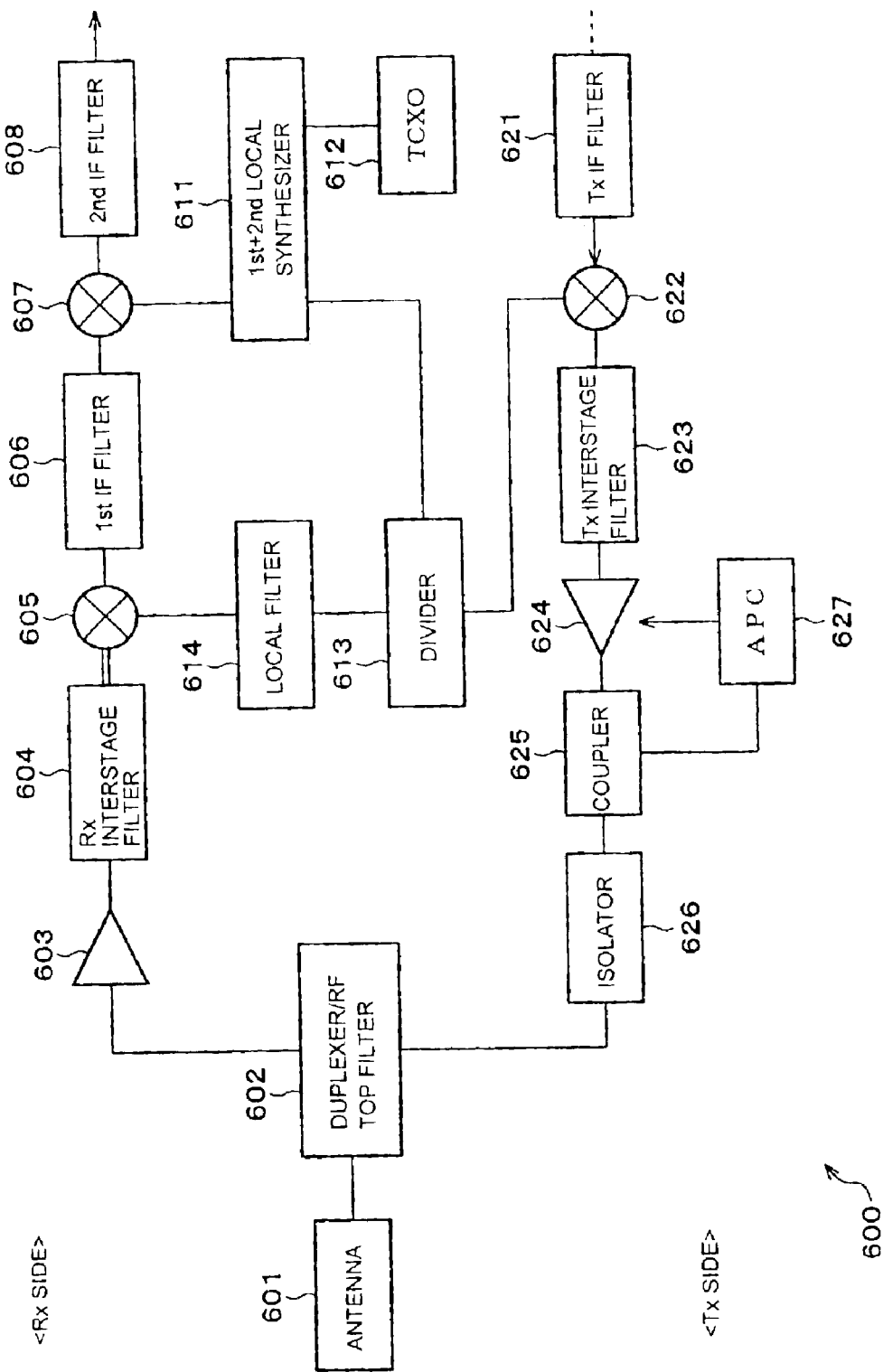
FIG. 22 is a circuit block diagram of a communication apparatus including the SAW filter according to preferred embodiments of the present invention.
Figure 23:
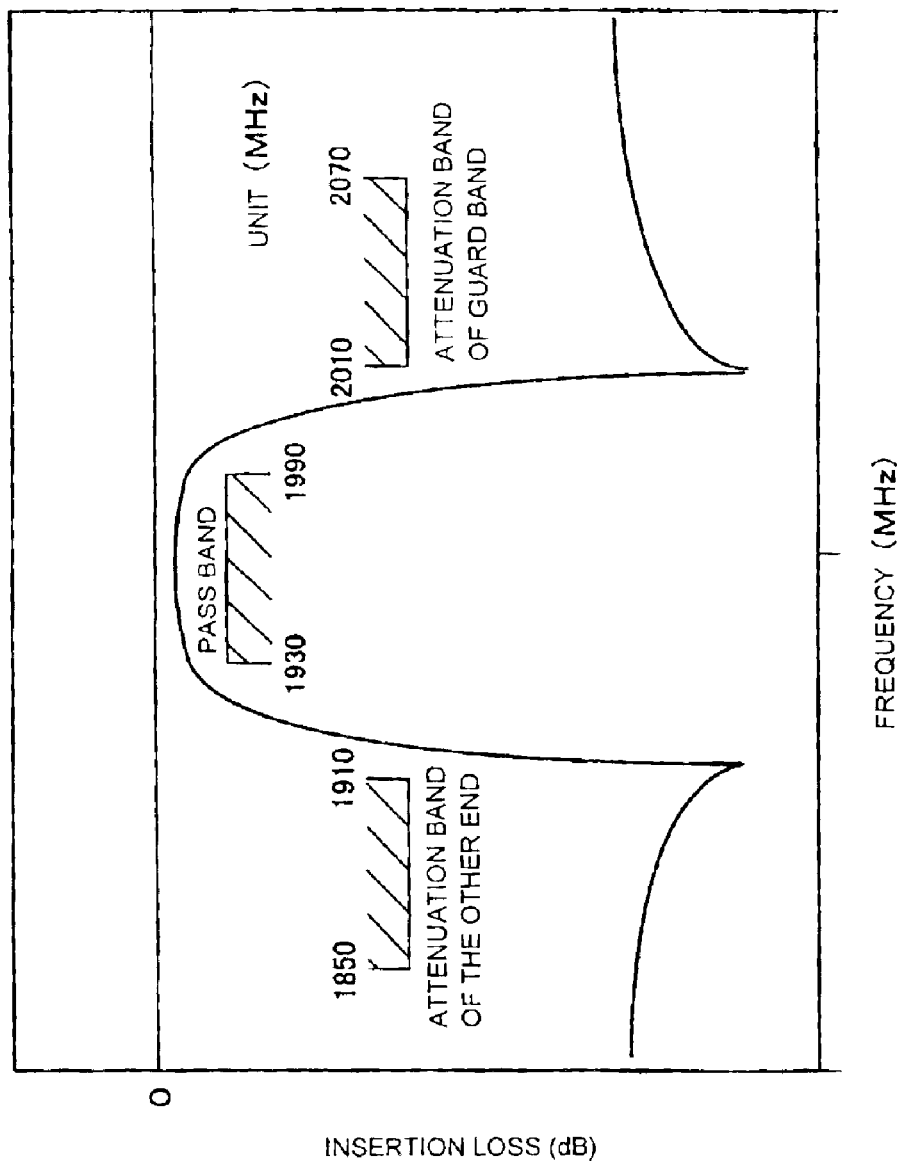
FIG. 23 is a graph showing the frequency characteristic of insertion loss in a known SAW filter.

Preferably, transmission is performed by balanced signals from the Rx interstage filter 604 to the mixer 605 in order to ensure a balance, as indicated by two lines of FIG. 22.

The transmission side (Tx side) of the communication apparatus 600 includes the antenna 601 and the duplexer/RF top filter 602, which are shared with the receiver side, a Tx IF filter 621, a mixer 622, a Tx interstage filter 623, an amplifier 624, a coupler 625, an isolator 626, and an automatic power control 627.

The SAW filter of the above-described preferred embodiments can be preferably used for the Rx interstage filter 604, the 1st IF filter 606, the Tx IF filter 621, and the Tx interstage filter 623.

In the SAW filter according to preferred embodiments of the present invention, the reflection characteristic in the pass band is greatly improved while maintaining a steep attenuation characteristic outside the pass band. Also, the attenuation characteristic outside the pass band in the vicinity of the pass band (high-frequency side and low-frequency side) and the reflection characteristic in the pass band is greatly improved in a well balanced manner.

As a result, a SAW filter in which reflection and attenuation characteristics are improved and loss is greatly reduced as compared with the known art. Accordingly, in the communication apparatus of the preferred embodiments of the present invention including the above-described SAW filter, a transmission characteristic is greatly improved.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A surface acoustic wave filter comprising:
   a piezoelectric substrate; and
   a plurality of one-terminal-pair surface acoustic wave resonators disposed on the piezoelectric substrate in a ladder configuration, each of the plurality of one-terminal-pair surface acoustic wave resonators including an IDT electrode having a pair of comb electrodes; wherein
   the plurality of one-terminal-pair surface acoustic wave resonators includes series resonators and at least one of the series resonators is thinned; and
   the IDT electrode of at least one of the series resonators has an electrode pitch that is different from that of the IDT electrodes of the other series resonators.

2. The surface acoustic wave filter according to claim 1, wherein all of the series resonators are thinned.

3. The surface acoustic wave filter according to claim 1, wherein the IDT electrode of at least one of the series resonators has a thinning ratio and an electrode pitch different from those of the IDT electrodes of the other series resonators.

4. The surface acoustic wave filter according to claim 3, wherein the plurality of one-terminal-pair surface acoustic wave resonators are arranged in a substantially T-shaped configuration, in which a series resonator is connected to each of input/output sides, and at least one of the series resonators other than the series resonator connected to the input/output sides has a thinning ratio and an electrode pitch different from those of the other series resonators.

5. The surface acoustic wave filter according to claim 4, wherein the series resonator other than the series resonator connected to the input/output sides has a greater thinning ratio and a smaller electrode pitch than those of the other series resonators.

6. The surface acoustic wave filter according to claim 1, wherein the filter defines a transmission filter which requires attenuation outside a pass band at the vicinity of a high-frequency side of the pass band.

7. A branching filter comprising the surface acoustic wave filter according to claim 1.

8. A communication apparatus comprising the surface acoustic wave filter according to claim 1.

9. A surface acoustic wave filter comprising:
   a piezoelectric substrate; and
   a plurality of one-terminal-pair surface acoustic wave resonators disposed on the piezoelectric substrate in a ladder configuration, each of the plurality of one-terminal-pair surface acoustic wave resonators including an IDT electrode having a pair of comb electrodes; wherein
   the plurality of one-terminal-pair surface acoustic wave resonators includes parallel resonators and at least one of the parallel resonators is thinned; and
   the IDT electrode of at least one of the parallel resonators has an electrode pitch different from that of the IDT electrodes of the other parallel resonators.

10. The surface acoustic wave filter according to claim 9, wherein all of the parallel resonators are thinned.

11. The surface acoustic wave filter according to claim 9, wherein the IDT electrode of at least one of the parallel resonators has a thinning ratio and an electrode pitch different from those of the IDT electrodes of the other parallel resonators.

12. The surface acoustic wave filter according to claim 11, wherein the plurality of one-terminal-pair surface acoustic wave resonators are arranged in a π-shape, in which a parallel resonator is connected to each of input/output sides, and at least one of the parallel resonators other than the parallel resonator connected to the input/output sides has a thinning ratio and an electrode pitch different from those of the other parallel resonators.

13. The surface acoustic wave filter according to claim 12, wherein the at least one of the parallel resonators other than the parallel resonator connected to the input/output sides has a greater thinning ratio and a smaller electrode pitch than those of the other parallel resonators.

14. The surface acoustic wave filter according to claim 9, wherein the filter defines a reception filter which requires attenuation outside a pass band at the vicinity of a low-frequency side of the pass band.

15. A branching filter comprising the surface acoustic wave filter according to claim 9.

16. A communication apparatus comprising the surface acoustic wave filter according to claim 9.

* * * * *